United States Patent
Fujimoto et al.

(10) Patent No.: US 10,437,794 B2
(45) Date of Patent: Oct. 8, 2019

(54) CLUSTERING APPARATUS, CLUSTERING METHOD, AND STORAGE MEDIUM

(71) Applicant: NIPPON CONTROL SYSTEM CORPORATION, Tokyo (JP)

(72) Inventors: Yoshihiro Fujimoto, Tokyo (JP); Satoaki Sawada, Tokyo (JP); Hidena Kamoi, Tokyo (JP); Yoriko Morisaki, Tokyo (JP)

(73) Assignee: Nippon Control System Corporation, Tokyo (JP)

( * ) Notice: Subject to any disclaimer, the term of this patent is extended or adjusted under 35 U.S.C. 154(b) by 312 days.

(21) Appl. No.: 15/506,179

(22) PCT Filed: Aug. 24, 2015

(86) PCT No.: PCT/JP2015/073691
§ 371 (c)(1),
(2) Date: Feb. 23, 2017

(87) PCT Pub. No.: WO2016/031759
PCT Pub. Date: Mar. 3, 2016

(65) Prior Publication Data
US 2017/0255656 A1  Sep. 7, 2017

(30) Foreign Application Priority Data

Aug. 29, 2014  (JP) .................................. 2014-188201
Dec. 16, 2014  (JP) .................................. 2014-253674

(51) Int. Cl.
*G06F 16/22* (2019.01)
*G06F 16/21* (2019.01)
(Continued)

(52) U.S. Cl.
CPC ........ *G06F 16/212* (2019.01); *G06F 16/2237* (2019.01); *G06F 16/285* (2019.01);
(Continued)

(58) Field of Classification Search
CPC ... G06F 16/212; G06F 16/2237; G06F 16/285
See application file for complete search history.

(56) References Cited

U.S. PATENT DOCUMENTS

| | | | |
|---|---|---|---|
| 2004/0128077 A1* | 7/2004 | Koebler | G06K 9/00147 702/19 |
| 2010/0086926 A1* | 4/2010 | Craig | G16B 20/00 435/6.1 |

OTHER PUBLICATIONS

Monismith et al, "Slime Mold as a Model for Numerical Optimization", IEEE, 2008, 8 pages.*

(Continued)

*Primary Examiner* — Loc Tran
(74) *Attorney, Agent, or Firm* — McDermott Will & Emery LLP

(57) ABSTRACT

A clustering apparatus includes: an accepting unit that accepts pieces of target data, each of which is a vector; a slime mold information constructing unit that constructs, using the pieces of target data, slime mold information, which is information having one piece of hub cell information corresponding to a central cell of a slime mold and one or more pieces of branch cell information corresponding to a cell that is divided from the central cell for predation; and a clustering unit that associates each of the pieces of target data with branch cell information having the shortest distance from a vector contained in the branch cell information to the target data, among the one or more pieces of branch cell information contained in the constructed slime mold information, thereby clustering the target data into clusters in the same number as that of the pieces of branch cell information.

8 Claims, 23 Drawing Sheets

| Concept of slime mold | Description |
|---|---|
| Slime mold cell | Point represented by ● and ○ in left diagram |
| Hub | Slime mold cell represented by ○ in left diagram, generated in step of initializing slime mold |
| Branch | Slime mold cell represented by ● in left diagram, generated in step of adding slime mold |
| Slime mold | Group of slime mold cells represented by ● and ○ in left diagram |
| Protoplasm information | Volume, velocity, and acceleration information contained in each slime mold cell |
| Vector information | Vector value contained in each slime mold cell, vector having the same number of dimensions as that of analysis target data, and representing position of slime mold cell |
| Learning coefficient | Coefficient contained in each slime mold cell and affecting update of vector information |

(51) Int. Cl.
*G06N 20/00* (2019.01)
*G06F 17/16* (2006.01)
*G06F 17/50* (2006.01)
*G06N 3/12* (2006.01)
*G06K 9/62* (2006.01)
*G06F 16/28* (2019.01)
*G06K 9/00* (2006.01)

(52) U.S. Cl.
CPC .......... *G06F 17/16* (2013.01); *G06F 17/5009* (2013.01); *G06K 9/00* (2013.01); *G06K 9/6217* (2013.01); *G06N 3/126* (2013.01); *G06N 20/00* (2019.01)

(56) References Cited

OTHER PUBLICATIONS

Li et al, "Slime mold inspired routing protocols for wireless sensor networks", Springer Science, 2011, 41 pages.*
K. Sunakawa et al., "Growing Self-organizing Maps based on slime mold dynamics," IEICE Technical Report, 2011, vol. 110, No. 461, pp. 391-394, with English language abstract.
K. Sunakawa et al., "A TSP solver by growing SOM using local distance information," IEICE Technical Report, 2011, pp. 69-74, with English language abstract.
L. Zhu, "Amoeba-based Computer and its Probability Exploration Model," NII Electronic Library Service, 2011, vol. 55, No. 12, pp. 526-531, with English language abstract.
International Search Report issued in PCT/JP2015/073691, dated Nov. 6, 2015, with English language translation.

* cited by examiner

| ID | Dimension 1 | Dimension 2 | ... | Dimension n-1 | Dimension n |
|---|---|---|---|---|---|
| . | . | . | . | . | . |
| . | . | . | . | . | . |
| . | . | . | . | . | . |
| 011 | 7 | 3 | ... | 5 | 12 |
| 012 | 10 | 18 | ... | 10 | 14 |
| 013 | 12 | 18 | ... | 17 | 16 |
| 014 | 1 | 20 | ... | 17 | 18 |
| 015 | 18 | 2 | ... | 2 | 9 |
| . | . | . | . | . | . |
| . | . | . | . | . | . |
| . | . | . | . | . | . |

FIG.11

| Dimension 1 | Dimension 2 | ... | Dimension n-1 | Dimension n | Volume | Velocity | Acceleration |
|---|---|---|---|---|---|---|---|
| 15 | 1 | ... | 8 | 3 | 0 | 0 | 0 |

FIG.12

| ID | Dimension 1 | Dimension 2 | ... | Dimension n-1 | Dimension n | Volume | Velocity | Acceleration | Learning coefficient | Number of times of being winner |
|----|-------------|-------------|-----|---------------|-------------|--------|----------|--------------|----------------------|---------------------------------|
| 1  | 7           | 2           | ... | 2             | 1           | 1      | 1        | 1            | 1                    | 0                               |

FIG. 13

| Dimension 1 | Dimension 2 | ... | Dimension n-1 | Dimension n | Volume | Velocity | Acceleration |
|---|---|---|---|---|---|---|---|
| 15 | 1 | ... | 8 | 3 | -2 | 0 | 0 |

FIG.14

| ID | Dimension 1 | Dimension 2 | ... | Dimension n-1 | Dimension n | Volume | Velocity | Acceleration | Learning coefficient | Number of times of being winner |
|---|---|---|---|---|---|---|---|---|---|---|
| 1 | 7 | 2 | ... | 2 | 1 | 2 | 1 | 0 | 1 | 0 |

FIG. 15

| ID | Dimension 1 | Dimension 2 | ... | Dimension n-1 | Dimension n | Volume | Velocity | Acceleration | Learning coefficient | Number of times of being winner |
|---|---|---|---|---|---|---|---|---|---|---|
| 1 | 7 | 2 | ... | 2 | 1 | 2 | 1 | 0 | 1 | 0 |
| 2 | 4 | 5 | ... | 18 | 10 | 1 | 1 | 1 | 1 | 0 |

FIG. 16

| Dimension 1 | Dimension 2 | ... | Dimension n-1 | Dimension n | Volume | Velocity | Acceleration |
|---|---|---|---|---|---|---|---|
| 15 | 1 | ... | 8 | 3 | -6 | 0 | 0 |

FIG.17

| ID | Dimension 1 | Dimension 2 | ... | Dimension n-1 | Dimension n | Volume | Velocity | Acceleration | Learning coefficient | Number of times of being winner |
|---|---|---|---|---|---|---|---|---|---|---|
| 1 | 7 | 2 | ... | 2 | 1 | 3 | 1 | 0 | 1 | 1 |
| 2 | 4 | 5 | ... | 18 | 10 | 1 | 0 | -1 | 1 | 0 |

FIG. 18

| ID | Dimension 1 | Dimension 2 | ... | Dimension n-1 | Dimension n | Volume | Velocity | Acceleration | Learning coefficient | Number of times of being winner |
|----|-------------|-------------|-----|---------------|-------------|--------|----------|--------------|---------------------|-------------------------------|
| 1  | 5           | 8           | ... | 20            | 6           | 3      | 1        | 0            | 1                   | 1                             |
| 2  | 4           | 5           | ... | 18            | 10          | 1      | 0        | -1           | 1                   | 0                             |

FIG. 19

| ID | Dimension 1 | Dimension 2 | ... | Dimension n-1 | Dimension n | Volume | Velocity | Acceleration | Learning coefficient | Number of times of being winner |
|---|---|---|---|---|---|---|---|---|---|---|
| 1 | 5 | 8 | ... | 20 | 6 | 3 | 1 | 0 | 1 | 1 |
| 2 | 4 | 5 | ... | 18 | 10 | 1 | 0 | -1 | 0.77 | 0 |
| 3 | 17 | 15 | ... | 2 | 7 | 1 | 0 | -1 | 1 | 0 |
| 4 | 19 | 9 | ... | 12 | 5 | 2 | 0 | 1 | 0.25 | 0 |
| 5 | 11 | 1 | ... | 17 | 7 | 2 | 0 | -1 | 1 | 3 |
| ... | ... | ... | ... | ... | ... | ... | ... | ... | ... | ... |

FIG. 20

| Cluster ID | Target ID |
|---|---|
| 1 | 001 |
| | 003 |
| | 005 |
| | 007 |
| 2 | 002 |
| | 004 |
| | 006 |
| | 008 |
| | 010 |
| 3 | 011 |
| | 015 |
| | 021 |
| | 025 |
| 4 | 012 |
| | 022 |
| ⋮ | ⋮ |

FIG.21

CLUSTERING APPARATUS, CLUSTERING METHOD, AND STORAGE MEDIUM

CROSS-REFERENCE TO RELATED APPLICATION

This application is the U.S. National Phase under 35 U.S.C. § 371 of International Patent Application No. PCT/JP2015/073691, filed on Aug. 24, 2015, which in turn claims the benefit and priority from Japanese Patent Application Number 2014-188201, filed Aug. 29, 2014 and Japanese Patent Application Number 2014-253674, filed Dec. 16, 2014 the subject matters of which are hereby incorporated by reference.

TECHNICAL FIELD

The present invention relates to a clustering apparatus and the like for clustering data.

BACKGROUND ART

Examples of data clustering methods include k-means clustering. According to this method, the number K of clusters has to be designated, and thus the value K significantly affects the level of precision of the clustering. Setting parameters such as the number K is dependent on individual skills based on experiences and intuitions, and is an operation that requires an inordinate amount of effort.

The obtaining an optimal parameter value in order to obtain a clustering result with a high level of precision from data targeted for clustering can be regarded as obtaining a solution to a combinatorial optimization problem. Various combinatorial optimization problems and solutions thereto have been proposed. For example, a method for calculating self-organizing maps as in Non-Patent Document 1 and a method for calculating tug-of-war models as in Non-Patent Document 2 are also examples of methods for solving combinatorial optimization problems.

CITATION LIST

Non-Patent Documents

Non-Patent Document 1: Saito et al., A TSP solver by growing SOM using local distance information, Technical Report of the Institute of Electronics, Information and Communication Engineers, NLP, Nonlinear Problems, 111 (276), 69-74, 2011-11-02

Non-Patent Document 2: Aono et al., Amoeba-based Computer and its Probability Exploration Model, Journal of the Institute of Systems, Control and Information Engineers, 55(12), 526-531, 2011-12-15

SUMMARY OF INVENTION

Technical Problem

According to conventional clustering, it is necessary to set parameters in advance while determining characteristics and distributions of data targeted for clustering.

Solution to Problem

A first aspect of the present invention is directed to a clustering apparatus, including: an accepting unit that accepts two or more pieces of target data, each of which is data targeted for clustering and is a vector having two or more elements; a slime mold information constructing unit that constructs, using the two or more pieces of target data, slime mold information, which is information obtained by modeling a predation behavior by a slime mold, and is information having two or more pieces of cell information consisting of one piece of hub cell information corresponding to a central cell of the slime mold and one or more pieces of branch cell information each corresponding to a cell that is divided from the central cell for predation, the hub cell information and the branch cell information each having a vector in the same number of dimensions as that of the target data; a clustering unit that associates each of the two or more pieces of target data with branch cell information having the shortest distance from the vector contained in the branch cell information to the target data, among the one or more pieces of branch cell information contained in the slime mold information constructed by the slime mold information constructing unit, thereby clustering the target data into clusters in the same number as that of the pieces of branch cell information; and an output unit that outputs a clustering result obtained by the clustering unit, wherein the slime mold information constructing unit includes: a hub cell information constructing part that acquires representative data, which is a vector representing the two or more pieces of target data, and constructs hub cell information having a vector that is the representative data; and a branch cell information constructing part that performs processing that constructs new branch cell information, and processing that updates the vector contained in the constructed branch cell information so as to reduce a distance to any one piece of target data among the two or more pieces of target data, using the two or more pieces of target data and the constructed slime mold information.

With this configuration, it is possible to perform clustering more precisely, without setting parameters in advance.

Furthermore, a second aspect of the present invention is directed to the clustering apparatus according to the first aspect, wherein the branch cell information constructing part selects one piece of target data once or more from among the two or more pieces of target data, specifies winner cell information, which is cell information having a vector having the shortest distance to the one piece of target data, from the constructed slime mold information, and, in a case where the winner cell information is hub cell information, constructs new branch cell information, and, in a case where the winner cell information is branch cell information, updates a vector contained in the branch cell information so as to reduce a distance to the one piece of target data.

With this configuration, it is possible to perform clustering more precisely, without setting parameters in advance, by adding a new branch cell to the slime mold and moving the added branch cell closer to the target data supposed to express food.

Furthermore, a third aspect of the present invention is directed to the clustering apparatus according to the first or second aspect, wherein the branch cell information constructing part selects one piece of target data once or more from among the two or more pieces of target data, and, in a case where cell information having a vector having the shortest distance to the one piece of target data is hub cell information, calculates a vector that internally divides a vector contained in the hub cell information and the one piece of target data, and constructs new branch cell information having the calculated vector.

With this configuration, it is possible to perform clustering more precisely, without setting parameters in advance, by adding a branch cell to the slime mold between the target data supposed to express food and the hub cell.

Furthermore, a fourth aspect of the present invention is directed to the clustering apparatus according to any one of the first to third aspects, wherein the branch cell information has a learning coefficient, which is a coefficient that is used to update a vector contained in the branch cell information, and the branch cell information constructing part selects one piece of target data once or more from among the two or more pieces of target data, and, in a case where cell information having a vector having the shortest distance to the one piece of target data is branch cell information, updates a vector contained in the branch cell information so as to reduce a distance to the one piece of target data using the learning coefficient contained in the branch cell information, the vector contained in the branch cell information, and the one piece of target data.

With this configuration, it is possible to perform clustering more precisely, without setting parameters in advance, by moving a branch cell closer to the target data supposed to express food according to a learning coefficient of the branch cell.

Furthermore, a fifth aspect of the present invention is directed to the clustering apparatus according to any one of the first to fourth aspects, wherein the branch cell information constructing part selects one piece of target data once or more from among the two or more pieces of target data, counts the number of times of learning, which is the number of times that the selection was performed, each time the selection was performed, and, in a case where the number of times of learning is large enough to satisfy a predetermined condition, ends the construction of the branch cell information.

With this configuration, it is possible to perform clustering more precisely, without setting parameters in advance, by ending the construction of the branch cell information in the case where the number of times of learning is large enough to satisfy a predetermined condition.

Furthermore, a sixth aspect of the present invention is directed to the clustering apparatus according to any one of the first to fourth aspects, wherein the branch cell information constructing part selects one piece of target data once or more from among the two or more pieces of target data, counts the number of times of learning, which is the number of times that the selection was performed, each time the selection was performed, and, in a case where a difference between the current number of times of learning and the number of times of learning in which new branch cell information was constructed is larger than a value obtained by dividing the number of pieces of target data by the number of pieces of branch cell information contained in the constructed slime mold information, ends the construction of the branch cell information.

With this configuration, it is possible to perform clustering more precisely, without setting parameters in advance, by ending the construction of the branch cell information in the case where a difference between the current number of times of learning and the number of times of learning in which new branch cell information was constructed is larger than a value obtained by dividing the number of pieces of target data by the number of pieces of cell information contained in the constructed slime mold information.

Furthermore, a seventh aspect of the present invention is directed to the clustering apparatus according to any one of the first to fourth aspects, wherein, each time a vector contained in the constructed branch cell information is updated, the branch cell information constructing part calculates a movement amount, which is a distance between a vector before update and a vector after the update, for the branch cell information, acquires a largest movement amount, which is a movement amount with the largest value among calculated movement amounts, and, in a case where the calculated movement amount is 5% or less of the largest movement amount successively for a predetermined number of times, ends the construction of the branch cell information.

With this configuration, it is possible to perform clustering more precisely, without setting parameters in advance, by ending the construction of the branch cell information in the case where all of a predetermined number or more of latest movement amounts are 5% or less of the largest movement amount.

Advantageous Effects of Invention

With the clustering apparatus and the like according to the present invention, it is possible to perform clustering more precisely, without setting parameters in advance.

BRIEF DESCRIPTION OF DRAWINGS

FIG. 11 is a table showing an example of target data in the embodiment.

FIG. 12 is a table showing an example of hub cell information in the embodiment.

FIG. 13 is a table showing an example of branch cell information in the embodiment.

FIG. 14 is a table showing an example of hub cell information in the embodiment.

FIG. 15 is a table showing an example of branch cell information in the embodiment.

FIG. 16 is a table showing an example of branch cell information in the embodiment.

FIG. 17 is a table showing an example of hub cell information in the embodiment.

FIG. 18 is a table showing an example of branch cell information in the embodiment.

FIG. 19 is a table showing an example of branch cell information in the embodiment.

FIG. 20 is a table showing an example of branch cell information in the embodiment.

FIG. 21 is a table showing an example of cluster information in the embodiment.

DESCRIPTION OF EMBODIMENT

Figure 1:
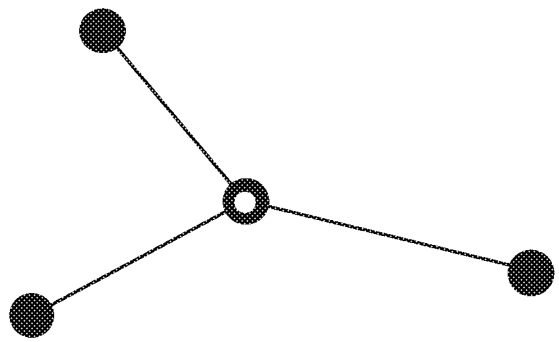
FIG. 1 is a conceptual diagram of a slime mold as a data model in Embodiment 1.

Hereinafter, embodiments of a clustering apparatus and the like according to the present invention will be described with reference to the drawings. Note that constituent elements denoted by the same reference numerals perform the same operations in the embodiments, and thus a description thereof may not be repeated. The formats, the contents, and the like of each piece of information described in the embodiments are merely an example, and the formats, the contents, and the like are not limited thereto as long as meanings of each piece of information can be expressed.

Embodiment 1

An algorithm of clustering that is performed by a clustering apparatus according to the present invention is implemented as a software program. A PC and a display screen are prepared. Data targeted for clustering is stored in a designated format in a folder. If the software program implementing the algorithm of the present invention is executed while using the data stored in the folder as input data, clustering not requiring parameter setting can be performed.

Hereinafter, an algorithm of clustering of the present invention will be described with reference to the attached drawings.

FIG. 1 is a conceptual diagram of a slime mold as a data model. A slime mold is constituted by two types of slime mold cells consisting of a hub and a branch. A hub is a slime mold cell generated in a step of initializing a slime mold. A branch is a slime mold cell generated in a step of adding a slime mold cell. A slime mold cell holds protoplasm information related to a learning degree and vector information expressing a position. Each group of multiple slime mold cells is taken as one slime mold.

In the algorithm of the present invention, learning of a slime mold is repeatedly performed through various types of calculation described later, so that clustering of target data is realized.

Figure 2:
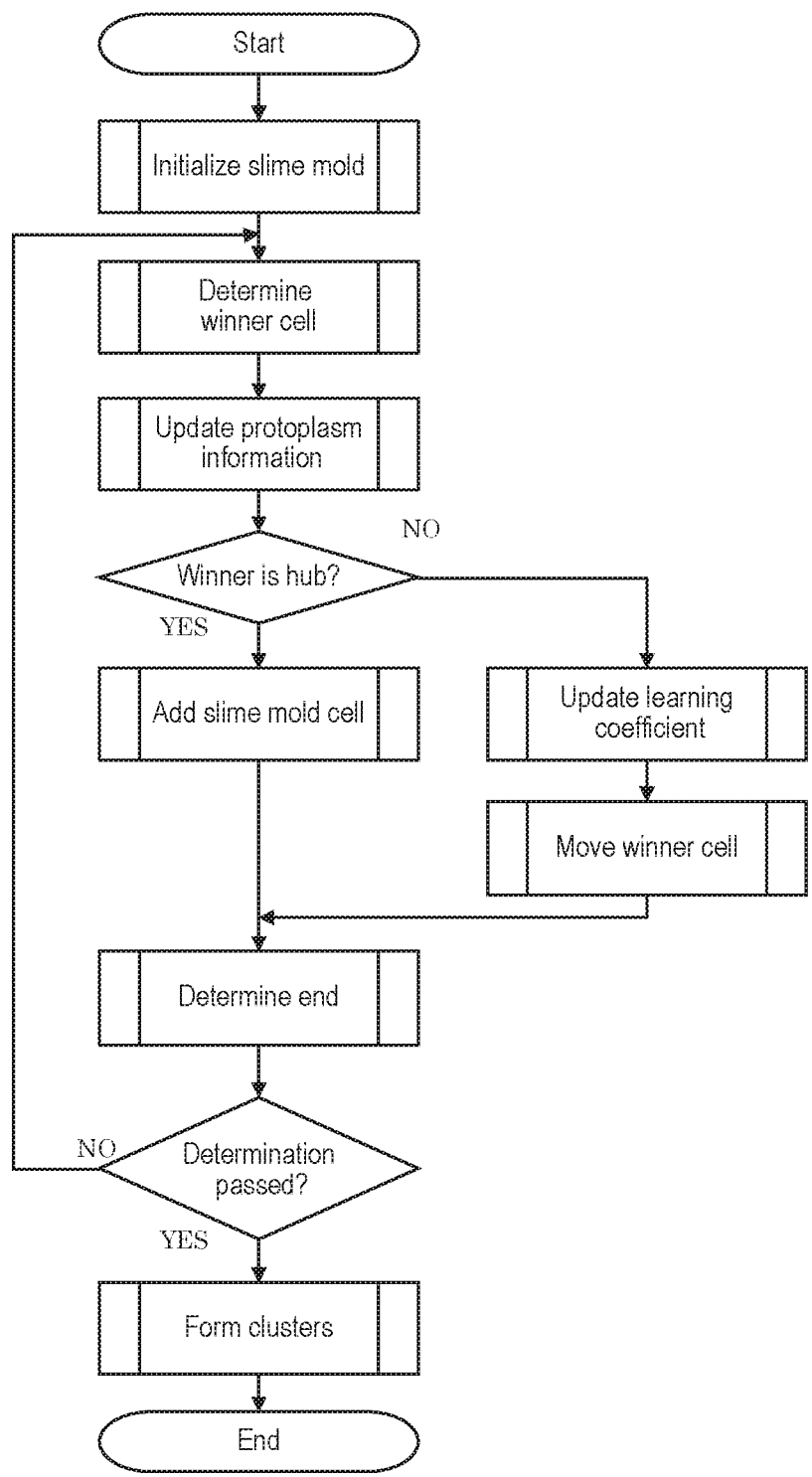
FIG. 2 is a flowchart illustrating the flow of clustering processing in the embodiment.

FIG. 2 is a flowchart of an algorithm of the clustering of the present invention. As shown in FIG. 2, the algorithm of the present invention is constituted by the flow including a step of initializing a slime mold, a step of determining a winner cell, a step of updating protoplasm information, a step of adding a slime mold cell, a step of updating a learning coefficient, a step of moving the winner cell, a step of performing end determination, and a step of forming clusters.

In the step of initializing a slime mold, a hub that is a center of the slime mold is generated. A center-of-gravity vector is calculated from all vector values of analysis target data for clustering. If a vector value of target data is expressed by Formula 1, a center-of-gravity vector can be calculated by Formula 2. One slime mold cell holding a value that matches this center-of-gravity vector is generated and is disposed as a hub. In this case, all initial values of a volume, a velocity, and an acceleration of protoplasm information contained in the hub are set to 0.

$$\vec{W}_i = (w_{1i}, w_{2i}, \ldots, w_{Ni})^T \quad \text{Formula 1}$$

where $\vec{W}_i$: vector of $i^{-th}$ piece of data ($1 \leq i \leq D$)
D: number of pieces of data
$w_{ji}$: $j^{-th}$ element of vector $\vec{W}_i$ ($1 \leq j \leq N$)

N: number of dimensions of vector $$\vec{V}_{ave} = \left( \frac{\sum_{k=1}^{D} w_{1k}}{D}, \frac{\sum_{k=1}^{D} w_{2k}}{D}, \ldots, \frac{\sum_{k=1}^{D} w_{Nk}}{D} \right)^T \quad \text{Formula 2}$$

where $\vec{V}_{ave}$: center-of-gravity vector
D: number of pieces of data
$w_{ji}$: $j^{-th}$ element of vector $\vec{W}_i$ ($1 \leq j \leq N$)
N: number of dimensions of vector In the step of determining a winner cell, a slime mold cell that is to be moved is calculated. One piece of data is extracted at random from the analysis target data for clustering, and is taken as input data. A slime mold cell having the shortest distance from the input data is calculated from among all slime mold cells. The calculated slime mold cell is referred to as a winner cell. In the calculation of the distance, the distance is obtained from a vector of the input data and a vector of each slime mold cell.

In the step of updating protoplasm information, the protoplasm information of all slime mold cells is updated. First, processing that calculates a sol amount, processing that updates an acceleration, processing that updates a velocity, and processing that updates a volume are performed on each branch. The volume of the hub is updated from the volume of each branch. The sol amount of each branch is calculated as in Formula 3. The acceleration is updated by obtaining the acceleration of the branch from Table 1 based on the calculated sol amount of the branch and whether or not the branch is a winner cell. The velocity is updated by adding the calculated acceleration to the current velocity of the branch. The volume is updated by adding the updated velocity to the current volume of the branch. The volume of the hub is updated by subtracting the sum of the updated volumes of all branches from the current volume of the hub.

$$sol_i = vol_{hub} + Q(i) - \frac{\sum_{j \neq i}^{M} Q(j)}{M - 1} \quad \text{Formula 3}$$

where $sol_i$: sol amount of branch i
$vol_{hub}$: volume of hub
Q(k)=(current number of times of learning)−(number of times that branch k is winner cell)
M: number of branches

TABLE 1

|  | Sol amount is positive value | Sol amount is 0 | Sol amount is negative value |
| --- | --- | --- | --- |
| Branch is winner cell | 1 | 1 | 0 |
| Branch is not winner cell | 0 | −1 | −1 |

Then, it is determined whether the winner cell is a hub or a branch. If the winner cell is a hub, the procedure advances to the step of adding a slime mold cell. If the winner cell is a branch, the procedure advances to the step of updating a learning coefficient and the step of moving the winner cell.

In the step of adding a slime mold cell, a slime mold cell as a new branch is generated. An internal division vector of the vector of the hub and the vector of the input data is calculated. A preset value is used as an internal division ratio. A slime mold cell is newly generated, and the calculated internal division vector is set to vector information of the generated slime mold cell.

In the step of updating a learning coefficient, learning coefficients of all branches are updated. On each branch, it is determined whether or not the acceleration calculated in the step of updating protoplasm information is a positive value. If the acceleration of the branch is a positive value, the learning coefficient is not updated. If the acceleration of the branch is not a positive value, the learning coefficient is updated. The learning coefficient is updated as in Formula 4.

$$\alpha = \frac{\alpha_{ini}}{\alpha_{ini}X + 1} \quad \text{Formula 4}$$

where $\alpha$: learning coefficient
$\alpha_{ini}$: initial value of learning coefficient
X: number of times of learning In the step of moving the winner cell, the vector information of the winner cell is updated. The vector of the winner cell is updated as in Formula 5.

$$\vec{V}_x = \vec{V}_x + \alpha_x(\vec{W} - \vec{V}_x) \quad \text{Formula 5}$$

where $\vec{V}_x$: vector of branch x
$\alpha_x$: learning coefficient of branch x
$\vec{W}$: vector of input data In the step of performing end determination, first, it is determined (a) whether or not the maximum number of times of learning has been reached, and, if the maximum number of times of learning has been reached, it is determined that that end determination is passed, and the procedure advances to the step of forming clusters.

If the determination (a) is failed, the determination (b) below is performed. If the determination (b) is also failed, the determination (c) is performed. The determination (c) is performed on each branch. If the determination on the branches is passed, the step of performing end determination is ended, and the procedure advances to the step of forming clusters.

Determination (b): if Formula 6 is true, it is determined that the end determination is passed.

$$T - t > D/A \quad \text{Formula 6}$$

where T: current number of times of learning
t: latest number of times of learning in which branch was added
D: number of pieces of data
A: current number of branch cells Determination (c): if the determination (b) is failed, a threshold is calculated. In the branches, the largest value among the movement amounts up to that point of time is acquired, and a value corresponding to 5% of the largest movement amount is taken as the threshold. Next, a comparison is performed as to whether the movement amount of the winner cell in latest five times of learning is at the threshold or less. If the movement amount of the winner cell is at the threshold or less in all of the latest five times of learning, it is determined that the end determination is passed. If the movement amount of the winner cell is larger than the threshold even once in the latest five times of learning, it is determined that the end determination is failed.

If the end determination is failed, the procedure is restarted from the step of determining a winner cell. If the end determination is passed, the procedure advances to the step of forming clusters.

In the step of forming clusters, clusters are formed in the same number as that of the branches. Each piece of analysis target data is tagged to a branch having the shortest distance to the target data. A group of pieces of data tagged to each branch is regarded as a cluster, and thus clusters in the same number as that of the branches can be formed.

Embodiment 2

In this embodiment, a clustering apparatus 1 will be described that constructs hub cell information and branch cell information using data targeted for clustering, thereby constructing slime mold information, and clusters the data using the hub cell information contained in the slime mold information. In this embodiment, the steps described in Embodiment 1 will be described in more detail.

Furthermore, in this embodiment, data targeted for clustering (hereinafter, referred to as target data, as appropriate) is typically information having two or more elements. The number of the elements may be, for example, one or more. The elements contained in the target data are preferably numerical values. The numerical values may be integer numbers, may be real numbers, or a may be natural numbers. Since the target data has two or more elements, it is a so-called vector. That is to say, for example, if target data has two elements, it is a two-dimensional vector. For example, if target data has five elements, it is a five-dimensional vector. Accordingly, the target data is hereinafter referred to as, as appropriate, a vector, or information having a vector.

Furthermore, the target data is, for example, document data, personal data, or the like. For example, if the target data is document data, the elements contained in the document data are, for example, the number of times that each of two or more predetermined morphemes appears in documents, the importance of each of two or more predetermined morphemes in documents, information (e.g., ID, etc.) for identifying each of two or more morphemes that appear in documents, or the like. The morphemes may be, for example, words, phrases, nouns, or the like. For example, if the target data is personal data, the elements contained in the personal data are, for example, ages, sexes, blood types, birth dates, birthplaces, interests, or the like. The sexes, blood types, birthplaces, interests and the like are typically indicated as numerical values.

Furthermore, the target data may be regarded as information corresponding to food that is captured by a slime mold, information supposed to express food that is captured by a slime mold, or the like. The capture may be, for example, predation, grazing, or the like.

Furthermore, the target data may be, for example, a vector acquired based on a clustering target. For example, if a clustering target is electronic data, the vector acquired based on the clustering target is a vector obtained as a result of predetermined processing performed on the electronic data. The predetermined processing is processing that converts electronic data into a vector, processing that constructs a vector using electronic data, or the like. For example, if a clustering target is an object (tangible thing), the vector acquired based on the clustering target is a vector whose element is an objective or subjective attribute value (numerical value) of the object. That is to say, for example, if a user wants to perform clustering of two or more documents, for example, the target data is vectors whose element is the number of times that each of two or more morphemes appears in the two or more documents. For example, if a user wants to perform clustering of people, for example, the target data is vectors whose element is an attribute value (numerical value) such as ages, sexes, blood types, or the like of the people.

Furthermore, in this embodiment, the slime mold information is information obtained by modeling a predation behavior by a slime mold. The predation behavior by a slime mold is, for example, a behavior in which a slime mold grows toward food, a behavior in which a slime mold undergoes cell division and cells after the division move toward food, or the like. That is to say, information obtained by modeling a predation behavior by a slime mold is, for example, information for expressing a manner in which a slime mold grows toward food, a slime mold undergoes cell division and cells after the division move toward food, or the like, in order that the slime mold capture food. The slime mold information may be regarded as, for example, information for expressing a predation behavior by a slime mold, information indicating a predation behavior by a slime mold, information based on a predation behavior model of a slime mold, information based on a growth model of a slime mold, information based on a mathematical model of a slime mold, or the like. The slime mold information may be regarded as information corresponding to a slime mold. The slime mold information may be regarded as information for expressing a slime mold. Accordingly, the slime mold information may be hereinafter referred to as, as appropriate, a slime mold.

Furthermore, the slime mold information typically has two or more pieces of cell information. The cell information is information corresponding to a cell of a slime mold. The cell information may be regarded as information for expressing a cell of a slime mold. Accordingly, the cell information may be hereinafter referred to as, as appropriate, a cell. The slime mold information has two types of cell information. The two types of cell information are hub cell information and branch cell information. The slime mold information is constructed by a slime mold information constructing unit 12 (described later). The slime mold information ultimately constructed by the slime mold information constructing unit 12 (described later) has one piece of hub cell information and one or more pieces of branch cell information.

The hub cell information is information corresponding to a central cell of a slime mold. In this case, the "central" does not refer to the center as a physical position. In other words, the "central" does not correspond to a so-called "center of gravity". The "central" refers to a "center" in terms of status or concept. That is to say, the "central" has the same meaning, for example, as "central" in a "central" person in a drama, a "central" person in a story, a "central" person in an organization, a "central" city in Japan, a country that plays a "central" role in the world economy, or the like. Accordingly, the central cell of a slime mold may be referred to as, for example, a core cell of a slime mold, a reference cell of a slime mold, a base cell of a slime mold, or the like. The hub cell information may be regarded as information for expressing a central cell of a slime mold. Accordingly, the hub cell information may be hereinafter referred to as, as appropriate, a hub cell or a hub.

Furthermore, the branch cell information is information corresponding to, in a slime mold, a cell that is divided from the central cell for predation. The branch cell information may be regarded as information for expressing a cell that is divided from the central cell for predation. Accordingly, the branch cell information may be hereinafter referred to as, as appropriate, a branch cell or a branch.

Furthermore, the cell information has a vector in the same number of dimensions as that of the target data. That is to say, the cell information has elements in the same number as two or more elements contained in the vector that is the target data. The vector contained in the cell information may be regarded as information indicating the position of the cell. The vector contained in the cell information may be hereinafter referred to as, as appropriate, vector information.

Furthermore, among the two types of cell information, the hub cell information typically has one type of protoplasm information. The protoplasm information is information indicating characteristics, properties, and the like of a cell. The one type of protoplasm information is a volume. The volume is information indicating a volume of a cell expressed by the hub cell information. The hub cell information may have, for example, other two types of protoplasm information. The two types of protoplasm information are a velocity and an acceleration. The velocity is information indicating a velocity during movement of a cell expressed by the hub cell information. The acceleration is information indicating an acceleration during movement of a cell expressed by the hub cell information. If the hub cell information has a velocity and an acceleration, the velocity and the acceleration are typically "0".

Furthermore, among the two types of cell information, the branch cell information has the above-described three types of protoplasm information. The branch cell information has, for example, one or more parameters. The parameters are, for example, a learning coefficient, the number of times of being specified as winner cell information, or the like. The learning coefficient is a coefficient that is used to update the constructed branch cell information. The learning coefficient may be regarded as, for example, information indicating an ability of the branch cell to move, information indicating a rate how the branch cell information moves, or the like. The learning coefficient is preferably, for example, a real number of 0 or more and 1 or less. The winner cell information is cell information having the shortest distance to one piece of target data (hereinafter, referred to as selected data, as appropriate) selected from among the two or more pieces of target data. That is to say, the number of times of being specified as winner cell information is the number of times of being specified as cell information having the shortest distance to the selected data.

Furthermore, in this embodiment, there is no limitation on the measurement unit of the distance between vectors. The "measurement unit" may be, for example, type, concept, or the like. Examples of the distance between vectors include Chebyshev distance, cosine distance, Euclidean distance, Mahalanobis distance, Manhattan distance, Minkowski distance, squared Euclidean distance, Tanimoto distance, weighted Euclidean distance, weighted Manhattan distance, and the like.

Furthermore, as shown in FIG. 2, the clustering apparatus 1 in this embodiment performs a step of initializing a slime mold, a step of determining a winner cell, a step of updating protoplasm information, a step of adding a slime mold cell, a step of updating a learning coefficient, a step of moving the winner cell, a step of performing end determination, and a step of forming clusters.

Figure 3:
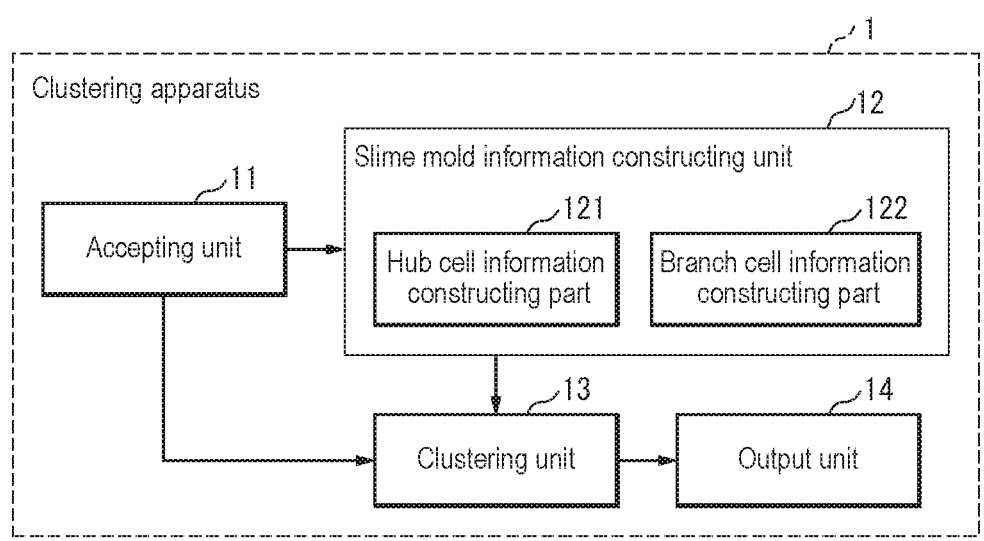
FIG. 3 is a block diagram of a clustering apparatus 1 in Embodiment 2.

FIG. 3 is a block diagram of the clustering apparatus 1 in this embodiment. The clustering apparatus 1 includes an accepting unit 11, a slime mold information constructing unit 12, a clustering unit 13, and an output unit 14. The slime mold information constructing unit 12 includes a hub cell information constructing part 121 and a branch cell information constructing part 122.

The accepting unit 11 accepts two or more pieces of target data. The accepting is a concept that encompasses acquiring information input from an input device such as a touch panel or a keyboard, reading information stored in a storage medium such as an optical disk, a magnetic disk, or a semiconductor memory, receiving information transmitted via a wired or wireless communication line, and the like.

Furthermore, the accepting unit 11 may accept information, an instruction, or the like input via any part such as a menu screen, a keyboard, or the like. The accepting unit 11 may be realized by control software for a menu screen, or a device driver for an input part such as a keyboard, for example.

The slime mold information constructing unit 12 constructs slime mold information. The slime mold information constructing unit 12 constructs slime mold information, for example, by constructing hub cell information that can be contained in the slime mold information and branch cell information that can be contained in the slime mold information. That is to say, the constructing slime mold information is constructing hub cell information and constructing branch cell information. The slime mold information constructed by the slime mold information constructing unit 12 ultimately has one piece of hub cell information and one or more pieces of branch cell information. The slime mold information constructing unit 12 constructs slime mold information, using the two or more pieces of target data accepted by the accepting unit 11, the constructed hub cell information, the constructed branch cell information, and the like. The slime mold information constructing unit 12 typically constructs slime mold information, using the following parts included in the slime mold information constructing unit 12.

The hub cell information constructing part 121 constructs hub cell information. The processing that constructs hub cell information corresponds to the step of initializing a slime mold in FIG. 2. The hub cell information constructing part 121 typically acquires representative data, which is a vector representing the two or more pieces of target data, as a vector contained in the hub cell information. The representative data is preferably a mean of the two or more pieces of target data, but may be a vector constituted by medians of elements of the two or more pieces of target data, or the like. The mean is typically a simple mean. The mean may be regarded as, for example, a center-of-gravity vector of the two or more pieces of target data. The mean may be, for example, a weighted mean. The hub cell information constructing part 121 typically constructs one piece of hub cell information. The hub cell information constructing part 121 typically calculates a mean of the two or more pieces of target data, as a vector contained in the hub cell information, and thus a description hereinafter will be given assuming that the hub cell information constructing part 121 calculates a mean.

Furthermore, for example, if a vector that is target data is expressed by Formula 1 in Embodiment 1, a mean (center-of-gravity vector) of two or more pieces of target data can be calculated by Formula 2 in Embodiment 1.

Furthermore, the hub cell information constructing part 121 provides a volume to hub cell information having the calculated vector. Accordingly, the hub cell information constructing part 121 constructs hub cell information having a vector and one type of protoplasm information. In this case, the hub cell information constructing part 121 may provide, for example, a velocity and an acceleration as well. Accordingly, the hub cell information constructing part 121 constructs hub cell information having a vector and three types of protoplasm information. In the case of providing protoplasm information to hub cell information having the calculated vector, the hub cell information constructing part 121 typically provides initial values of the protoplasm information. The initial values of all of the volume, the velocity, and the acceleration are "0".

The branch cell information constructing part 122 constructs branch cell information. The constructing branch cell information is constructing new branch cell information and updating the constructed branch cell information. The constructing new branch cell information may be generating new branch cell information, building new branch cell information, or the like. The updating the constructed branch cell information is updating a vector contained in the constructed branch cell information. The updating a vector is, for example, changing a vector, replacing a vector, or performing processing that adds or subtracts a numerical value to or from a vector, or multiplies or divides a vector by a numerical value. More specifically, the updating a vector is, for example, changing an element contained in a vector, replacing the element, or performing processing that adds or subtracts a numerical value to or from the element, or multiplies or divides the element by a numerical value. The processing that constructs new branch cell information corresponds to the step of adding a slime mold cell in FIG. 2. The processing that updates the constructed branch cell information corresponds to the step of moving the winner cell in FIG. 2. The branch cell information constructing part 122 performs the processing corresponding to the step of determining a winner cell in FIG. 2, the processing corresponding to the step of updating protoplasm information in FIG. 2, the processing corresponding to the step of updating a learning coefficient in FIG. 2, and the like. Hereinafter, the processes that are performed by the branch cell information constructing part 122 will be sequentially described.

(1) First, the branch cell information constructing part 122 selects one piece of target data from among the two or more pieces of target data. The selected one piece of target data is hereinafter referred to as, as appropriate, selected data. The branch cell information constructing part 122 selects target data once or more until an end condition is satisfied. The end condition will be described later in detail. The branch cell information constructing part 122 selects one piece of target data typically at random from among the two or more pieces of target data. The branch cell information constructing part 122 may select one piece of target data, for example, in a predetermined order from among the two or more pieces of target data. The branch cell information constructing part 122 preferably selects one piece of target data with no redundancy, for example, until an end condition is satisfied. Furthermore, for example, if an end condition is not satisfied when all pieces of target data are selected once, the branch cell information constructing part 122 may select selected data, for example, redundantly.

(2) Next, the branch cell information constructing part 122 specifies winner cell information from the cell information contained in the constructed slime mold information. The winner cell information is cell information having the shortest distance to the selected data. The distance is a distance between a vector that is the selected data and a vector contained in the cell information. The method, procedure, and the like for calculating a distance between two vectors are known, and thus a detailed description thereof has been omitted. The specifying winner cell information may be, for example, determining winner cell information, acquiring winner cell information, selecting winner cell information, or the like. The processing that specifies winner cell information corresponds to the step of determining a winner cell in FIG. 2. The step of determining a winner cell in FIG. 2 includes the above-described processing that selects one piece of target data.

For example, the branch cell information constructing part 122 calculates a distance between the selected data and each of the vectors contained in the pieces of cell information contained in the constructed slime mold information. The branch cell information constructing part 122 specifies cell information having a vector whose calculated distance is the shortest, as winner cell information.

Furthermore, for example, each time one piece of target data is selected, the branch cell information constructing part 122 counts the number of times that the selection was performed. The number of times that the selection was performed is hereinafter referred to as, as appropriate, the number of times of learning. The number of times of learning may be, for example, the number of times that winner cell information was specified. Typically, if one piece of target data is selected, winner cell information corresponding to the selected data is specified. That is to say, the number of times that one piece of target data was selected is the same as the number of times that winner cell information was specified. Accordingly, the number of times of learning may be either the number of times that one piece of target data was selected or the number of times that winner cell information was specified.

Furthermore, for example, if the specified winner cell information is branch cell information, the branch cell information constructing part 122 increments, by one, the number of times of being specified as winner cell information, contained in the branch cell information.

(3) Next, the branch cell information constructing part 122 updates protoplasm information contained in the cell information. The cell information targeted for update of the protoplasm information is all pieces of cell information contained in the constructed slime mold information. The branch cell information constructing part 122 performs processing on branch cell information, for example, so as to update the acceleration, the velocity, and the volume contained in the branch cell information. The branch cell information constructing part 122 performs processing on hub cell information, for example, so as to update the volume contained in the hub cell information. The processing that updates the protoplasm information corresponds to the step of updating protoplasm information in FIG. 2.

For example, using the branch cell information contained in the constructed slime mold information, the branch cell information constructing part 122 first calculates a sol amount for each piece of the branch cell information. The sol amount is information for expressing an amount of sol that is contained in a slime mold and that flows into a branch cell, which is a cell divided from a hub cell. The sol amount may be regarded as information indicating an amount of the sol. Specifically, the branch cell information constructing part 122 calculates a sol amount for each piece of branch cell information, for example, using information (protoplasm information or parameters) other than the vector contained in the branch cell information. For example, a sol amount corresponding to an $i^{-th}$ piece of branch cell information (sol amount of a branch i) can be calculated by Formula 3 in Embodiment 1.

Then, the branch cell information constructing part 122 acquires an acceleration of the branch cell information, according to the calculated sol amount and whether or not the branch cell information for which the sol amount is calculated is winner cell information. Specifically, the branch cell information constructing part 122 acquires an acceleration of the branch cell information according to Table 1 of Embodiment 1. The branch cell information constructing part 122 updates the acceleration contained in the branch cell information to the acquired acceleration.

For example, it is assumed that the branch cell information constructing part 122 has calculated a sol amount "2" for a certain piece of branch cell information. Furthermore, it is assumed that the branch cell information is branch cell information specified as winner cell information. It is assumed that the branch cell information has an acceleration "0". In this case, the branch cell information constructing part 122 acquires an acceleration "1" for the branch cell information according to Table 1 of Embodiment 1. The branch cell information constructing part 122 updates the acceleration "0" contained in the branch cell information to the acquired acceleration "1".

Furthermore, for example, it is assumed that the branch cell information constructing part 122 has calculated a sol amount "−1" for a certain piece of branch cell information. Furthermore, it is assumed that the branch cell information is branch cell information not specified as winner cell information. It is assumed that the branch cell information has an acceleration "1". In this case, the branch cell information constructing part 122 acquires an acceleration "−1" for the branch cell information according to Table 1 of Embodiment 1. The branch cell information constructing part 122 updates the acceleration "1" contained in the branch cell information to the acquired acceleration "−1".

Note that Table 1 of Embodiment 1 is merely an example, and the numerical values in Table 1 may be changed as appropriate. The acceleration may be acquired without using Table 1. That is to say, the branch cell information constructing part 122 may calculate an acceleration of branch cell information, for example, according to the number of times of being specified as winner cell information, a distance from selected data, or the like.

Furthermore, the branch cell information constructing part 122 adds the acquired acceleration to the velocity contained in the branch cell information, thereby updating the velocity contained in the branch cell information.

For example, it is assumed that the branch cell information constructing part 122 has acquired an acceleration "1" for a certain piece of branch cell information. Furthermore, it is assumed that the branch cell information has a velocity "1". In this case, the branch cell information constructing part 122 adds the acquired acceleration "1" to the velocity "1" contained in the branch cell information, thereby updating the velocity to "2".

Furthermore, for example, it is assumed that the branch cell information constructing part 122 has acquired an acceleration "−1" for a certain piece of branch cell information. Furthermore, it is assumed that the branch cell information has a velocity "0". In this case, the branch cell information constructing part 122 adds the acquired acceleration "−1" to the velocity "0" contained in the branch cell information, thereby updating the velocity to "−1".

Furthermore, the branch cell information constructing part 122 adds the updated velocity to the volume contained in the branch cell information, thereby updating the volume contained in the branch cell information.

For example, it is assumed that the branch cell information constructing part 122 has updated the velocity to "1" for a certain piece of branch cell information. Furthermore, it is assumed that the branch cell information has a volume "1". In this case, the branch cell information constructing part 122 adds "1", which is the acceleration contained in the branch cell information and is the acceleration after the update, to the volume "1" contained in the branch cell information, thereby updating the volume to "2".

Furthermore, for example, it is assumed that the branch cell information constructing part 122 has updated the velocity to "−1" for a certain piece of branch cell information. Furthermore, it is assumed that the branch cell information has a volume "0". In this case, the branch cell information constructing part 122 adds "−1", which is the acceleration contained in the branch cell information and is the acceleration after the update, to the volume "0" contained in the branch cell information, thereby updating the volume to "−1".

Furthermore, the branch cell information constructing part 122 subtracts the sum volume after the update contained in the branch cell information from the volume contained in the hub cell information, thereby updating the volume contained in the hub cell information. That is to say, the branch cell information constructing part 122 updates the protoplasm information (acceleration, velocity, and volume) contained in the branch cell information, for all pieces of branch cell information contained in the slime mold information, and then updates the protoplasm information (volume) contained in the hub cell information. The updating the volume contained in the hub cell information is processing for keeping the sum volume contained in all pieces of cell information contained in the slime mold information, uniform throughout the times of learning.

For example, it is assumed that the slime mold information has five pieces of branch cell information, and the branch cell information constructing part 122 has updated the volumes contained in the five pieces of branch cell information respectively to "3", "2", "0", "1", and "2". Furthermore, it is assumed that one piece of hub cell information contained in the slime mold information has a volume "10". In this case, the branch cell information constructing part 122 subtracts "8", which is the sum of the volumes contained in the pieces of branch cell information, from the volume "10" contained in the hub cell information, thereby updating the volume contained in the hub cell information to "2".

Furthermore, for example, it is assumed that the slime mold information has four pieces of branch cell information, and the branch cell information constructing part 122 has updated the volumes contained in the four pieces of branch cell information respectively to "1", "1", "1", and "1". Furthermore, it is assumed that one piece of hub cell information contained in the slime mold information has a volume "6". In this case, the branch cell information constructing part 122 subtracts "4", which is the sum of the volumes contained in the pieces of branch cell information, from the volume "6" contained in the hub cell information, thereby updating the volume contained in the hub cell information to "2".

(4) Next, the branch cell information constructing part 122 performs processing according to whether the winner cell information is hub cell information or branch cell information. For example, if the winner cell information is hub cell information, the branch cell information constructing part 122 constructs new branch cell information. The processing that constructs new branch cell information corresponds to the step of adding a slime mold cell in FIG. 2. For example, if the winner cell information is branch cell information, the branch cell information constructing part 122 updates the constructed branch cell information. The processing that updates the constructed branch cell information corresponds to the step of moving the winner cell in FIG. 2. For example, in the case of updating the constructed branch cell information, the branch cell information constructing part 122 first updates the learning coefficient, and then updates the constructed branch cell information. Hereinafter, these processes will be sequentially described.

(4-1) If the winner cell information is hub cell information, the branch cell information constructing part 122 constructs new branch cell information. The branch cell information constructing part 122 calculates an internal division vector of a vector contained in the hub cell information that is the winner cell information and a vector that is the selected data. The internal division ratio when calculating an internal division vector is determined in advance. The internal division ratio may not be determined in advance, for example. The branch cell information constructing part 122 may calculate the internal division ratio as appropriate, for example, according to the number of dimensions of the vector contained in the selected data, or the like. The branch cell information constructing part 122 constructs branch cell information having the calculated vector.

Furthermore, the branch cell information constructing part 122 provides the initial values of the protoplasm information and the initial values of the parameters to the constructed branch cell information. The protoplasm information is the volume, the velocity, and the acceleration. The initial values of the protoplasm information are typically determined in advance. The parameters are the learning coefficient and the number of times of being specified as winner cell information. The initial values of the parameters are typically determined in advance. The initial value of the number of times of being specified as winner cell information is "0".

(4-2) If the winner cell information is branch cell information, the branch cell information constructing part 122 updates the learning coefficient or updates the branch cell information.

For example, for all pieces of branch cell information having a negative acceleration (all pieces of branch cell information whose acceleration is negative), the branch cell information constructing part 122 updates the learning coefficient contained in the branch cell information. The "being negative" may be, for example, "not being positive". The branch cell information targeted for update of the learning coefficient may be, for example, all pieces of branch cell information having a non-positive acceleration. The branch cell information targeted for update of the learning coefficient typically includes branch cell information specified as winner cell information.

Furthermore, for example, if the acceleration contained in the branch cell information that is the winner cell information is positive, the branch cell information constructing part 122 updates the vector contained in the branch cell information so as to reduce a distance between the branch cell information and the selected data. The "being positive" may be, for example, "not being negative". The distance is a distance between the vector contained in the branch cell information and the vector that is the selected data.

In the case of updating the learning coefficient, for example, for all pieces of branch cell information contained in the constructed slime mold information, the branch cell information constructing part 122 determines whether or not the acceleration contained in the branch cell information is negative. The branch cell information constructing part 122 updates the learning coefficient contained in the branch cell information whose acceleration is negative. The branch cell information constructing part 122 does not update the learning coefficient contained in the branch cell information whose acceleration is not negative.

Furthermore, in the case of updating the learning coefficient, for example, for all pieces of branch cell information contained in the constructed slime mold information, the branch cell information constructing part 122 may determine whether or not the acceleration contained in the branch cell information is positive. In this case, the branch cell information constructing part 122 updates the learning coefficient contained in the branch cell information whose acceleration is not positive. In this case, the branch cell information constructing part 122 does not update the learning coefficient contained in the branch cell information whose acceleration is positive.

Furthermore, the branch cell information constructing part 122 calculates a new learning coefficient after the update, according to Formula 4 in Embodiment 1. In Formula 4, the initial value of the learning coefficient is typically determined in advance. The initial value of the learning coefficient is preferably, for example, "0.1".

Furthermore, in the case of updating the vector contained in the branch cell information, using the vector contained in the branch cell information that is the winner cell information and the vector that is the selected data, the branch cell information constructing part 122 updates the vector contained in the branch cell information. The updating the vector contained in the branch cell information may be regarded as, for example, processing that moves the position of the branch cell closer to the target data supposed to express food. A new vector after the update can be calculated by Formula 5 in Embodiment 1. In other words, the vector contained in the branch cell information that is the winner cell information can be updated by Formula 5 in Embodiment 1.

Note that Formula 5 can be regarded as processing that adds a scalar multiple obtained by multiplying a difference between the selected data and the vector contained in the branch cell information that is the winner cell information by a predetermined factor, to the vector contained in the branch cell information. In Formula 5, "vector of input data" is the selected data. In Formula 5, "learning coefficient of branch x" may be, for example, a predetermined fixed coefficient. Furthermore, "learning coefficient of branch x" may be calculated as appropriate, for example, according to the number of dimensions of the vector contained in the selected data, or the like.

(5) Next, the branch cell information constructing part 122 determines whether or not to end the construction of the branch cell information. The determination processing corresponds to the step of performing end determination in FIG. 2. The branch cell information constructing part 122 determines whether or not a predetermined condition (hereinafter, referred to as an end condition, as appropriate) is satisfied. If the end condition is satisfied, the branch cell information constructing part 122 determines to end the construction of the branch cell information. On the other hand, if the end condition is not satisfied, the branch cell information constructing part 122 again selects one piece of target data, and specifies winner cell information. The end condition is, for example, any one of the following conditions (a), (b), and (c).

(a) The number of times of learning is large enough to satisfy a predetermined condition.

(b) A difference between the current number of times of learning and the number of times of learning in which new branch cell information was constructed is larger than a value obtained by dividing the number of pieces of target data by the number of pieces of branch cell information contained in the constructed slime mold information.

(c) A movement amount is 5% or less of the largest movement amount successively for a predetermined number of times.

The condition (a) refers to, for example, a state in which the number of times of learning has reached the maximum number of times of learning. That is to say, the determining whether or not the end condition (a) is satisfied is determining whether or not the number of times of learning has reached the maximum number of times of learning. The determining whether or not the end condition (a) is satisfied is determining whether or not the number of times of learning is at a predetermined threshold or more.

Furthermore, the condition (b) refers to a state in which Formula 6 in Embodiment 1 is satisfied. The left-hand side of Formula 6 indicates a period during which new branch cell information is not constructed (a period during which a branch cell is not added to a slime mold). The clustering unit 13 (described later) clusters the target data into clusters in the same number as that of the pieces of branch cell information contained in the slime mold information. Accordingly, the right-hand side of Formula 6 indicates a mean of the number of pieces of target data constituting one cluster at a certain point in time.

Furthermore, in the condition (c), the movement amount is a length of a difference between a vector before update and a vector after the update, in the update of the vector contained in the hub cell information. In other words, the movement amount is a length of a difference vector between the vector before the update and the vector after the update. The length may be a magnitude. That is to say, the movement amount is an amount by which a branch cell moves in order to approach target data supposed to express food. The movement amount is also a length of a vector that is added to the vector of the branch x in Formula 5. In the condition (c), "5% of the largest movement amount" is a so-called threshold. Accordingly, "5% of the largest movement amount" is hereinafter referred to as, as appropriate, a threshold. The threshold may not be, for example, 5% of the largest movement amount. The threshold may be, for example, 1% of the largest movement amount, 10% of the largest movement amount, or the like. In the condition (c), "or less" may also be "less than".

For example, in the case of determining whether or not the end condition (a) is satisfied, the branch cell information constructing part 122 increments the number of times of learning by one, for example, as described above, each time one piece of target data is selected or each time winner cell information is specified. The branch cell information constructing part 122 determines whether or not the counted number of times of learning satisfies the end condition (a), for example, each time one piece of branch cell information is constructed. "Each time one piece of branch cell information is constructed" is, for example, each time new branch cell information is constructed or each time the constructed branch cell information is updated.

Furthermore, for example, in the case of determining whether or not the end condition (b) is satisfied, for example, if the winner cell information corresponding to the selected target data is branch cell information, the branch cell information constructing part 122 acquires the number of times of learning at that selection. The acquiring the number of times of learning is, for example, storing the number of times of learning in a predetermined storage area. The branch cell information constructing part 122 calculates a difference between the current number of times of learning and the number of times of learning in which new branch cell information was constructed, and a value (hereinafter, referred to as a quotient, as appropriate) obtained by dividing the number of pieces of target data by the number of pieces of cell information contained in the constructed slime mold information, for example, each time one piece of branch cell information is constructed. The branch cell information constructing part 122 determines whether or not the difference is larger than the quotient.

Furthermore, for example, in the case of determining whether or not the end condition (c) is satisfied, the branch cell information constructing part 122 calculates a movement amount, which is a distance between branch cell information before update and branch cell information after the update, for example, each time the constructed branch cell information is updated. The branch cell information constructing part 122 acquires the movement amount, as a so-called history. The acquiring is, for example, storing the movement amount in a predetermined storage area. The branch cell information constructing part 122 acquires a largest movement amount, which is a movement amount with the largest value, from the history, for example, each time the history is acquired. The branch cell information constructing part 122 calculates a threshold, for example, using the acquired largest movement amount. The branch cell information constructing part 122 determines whether or not latest n movement amounts (n is an integer of 1 or more) in the history are at the calculated threshold or less, for example, each time one piece of branch cell information is constructed. The constructing one piece of branch cell information is typically updating the constructed branch cell information. The constructing one piece of branch cell information may be, for example, constructing new branch cell information. In this case, if all the latest n movement amounts are at the threshold or less, the branch cell information constructing part 122 determines that the end condition (c) is satisfied. That is to say, the branch cell information constructing part 122 determines that the end condition (c) is not satisfied if even one of the latest n movement amounts is larger than the threshold.

Furthermore, for example, in the case of determining whether or not the end condition (c) is satisfied, the branch cell information constructing part 122 may acquire, for example, a history of the movement amount for each piece of branch cell information. In this case, for example, each time one piece of branch cell information is constructed, the branch cell information constructing part 122 acquires a largest movement amount from the history of the movement amount corresponding to the constructed branch cell information, and calculates a threshold. The constructing one piece of branch cell information is typically updating the constructed branch cell information. The constructing one piece of branch cell information may be, for example, constructing new branch cell information. The branch cell information constructing part 122 determines whether or not latest n movement amounts (n is an integer of 1 or more) in the history are at the calculated threshold or less. The subsequent processing is as described above, and thus a description thereof has been omitted.

Furthermore, the branch cell information constructing part 122 may perform determination as to whether or not each condition is satisfied, on the above-described three end conditions, for example, according to a predetermined priority order. The priority order in this case is preferably in order of (a), (b), and then (c). That is to say, in the case of this priority order, the branch cell information constructing part 122 determines whether or not the condition (a) is satisfied, and, if not satisfied, determines whether or not the condition (b) is satisfied. The branch cell information constructing part 122 determines whether or not the condition (b) is satisfied, and, if not satisfied, determines whether or not the condition (c) is satisfied.

Furthermore, according to the above-described procedure, the slime mold information constructing unit 12 (the branch cell information constructing part 122) constructs new branch cell information, typically, once or more. The slime mold information constructing unit 12 (the branch cell information constructing part 122) updates the constructed branch cell information, typically, 0 times or more.

The clustering unit 13 clusters the two or more pieces of target data, using the slime mold information constructed by the slime mold information constructing unit 12. The processing that clusters target data corresponds to the step of forming clusters in FIG. 2. The clustering is acquiring information indicating a clustering result (hereinafter, referred to as cluster information, as appropriate). It is sufficient that the cluster information can indicate one or at least two clusters, and there is no limitation on the data structure and the like. The cluster information is, for example, information having one or more pieces of data group information. The data group information is a group of one or more pieces of target data constituting a cluster. The constituting a cluster may be, for example, belonging to a cluster, being included in a cluster, being contained in a cluster, or the like. The cluster information is, for example, information having one or more pieces of association information. The association information is information for associating information for identifying a cluster with information for identifying each of one or more pieces of target data constituting the cluster.

Furthermore, the clustering unit 13 clusters the two or more pieces of target data into clusters in the same number as that of the pieces of branch cell information, typically based on a distance between each of one or more pieces of branch cell information contained in the slime mold information and each of the two or more pieces of target data. In other words, the clustering unit 13 forms clusters in the same number as that of the pieces of branch cell information contained in the slime mold information, from the two or more pieces of target data. Moreover, in other words, the clustering unit 13 tags each piece of target data to branch cell information having the shortest distance to the target data. The clustering unit 13 regards a group of pieces of target data tagged to each piece of branch cell information as a cluster, thereby forming clusters in the same number as that of the pieces of branch cell information. The distance between the branch cell information and the target data is a distance between a vector contained in the branch cell information and a vector that is the target data.

Specifically, the clustering unit 13 calculates a distance between, for example, each of the two or more pieces of target data and a vector contained in each of one or more pieces of branch cell information contained in the slime mold information ultimately constructed by the slime mold information constructing unit 12. Accordingly, for one piece of target data, distances in the same number as that of the pieces of the branch cell information are calculated. The clustering unit 13 associates, for example, each of the two or more pieces of target data with branch cell information having a vector corresponding to the shortest distance among the calculated one or more distances. The clustering unit 13 constructs, for each of the one or more pieces of branch cell information, cluster information using the target data associated with the branch cell information.

The output unit 14 outputs the clustering result obtained by the clustering unit 13. The outputting the clustering result is specifically outputting the cluster information acquired by the clustering unit 13. The output is a concept that encompasses display on a display screen, projection using a projector, printing by a printer, outputting a sound, transmission to an external display apparatus, accumulation in a storage medium, delivery of a processing result to another processing apparatus or another program, and the like. Note that it is assumed that in the case of transmitting or accumulating information or delivering a processing result, the output information is ultimately provided to a user.

Furthermore, the output unit 14 may be considered to include or to not include an output device such as a display screen or a speaker. The output unit 14 may be realized by driver software for an output device, a combination of driver software for an output device and the output device, or the like.

The slime mold information constructing unit 12, the hub cell information constructing part 121, the branch cell information constructing part 122, and the clustering unit 13 may be realized typically by MPUs, memories, or the like. Typically, the processing procedure of the slime mold information constructing unit 12 and the like is realized by software, and the software is stored in a storage medium such as a ROM. Note that the slime mold information constructing unit 12 and the like may also be realized also by hardware (a dedicated circuit).

Figure 4:
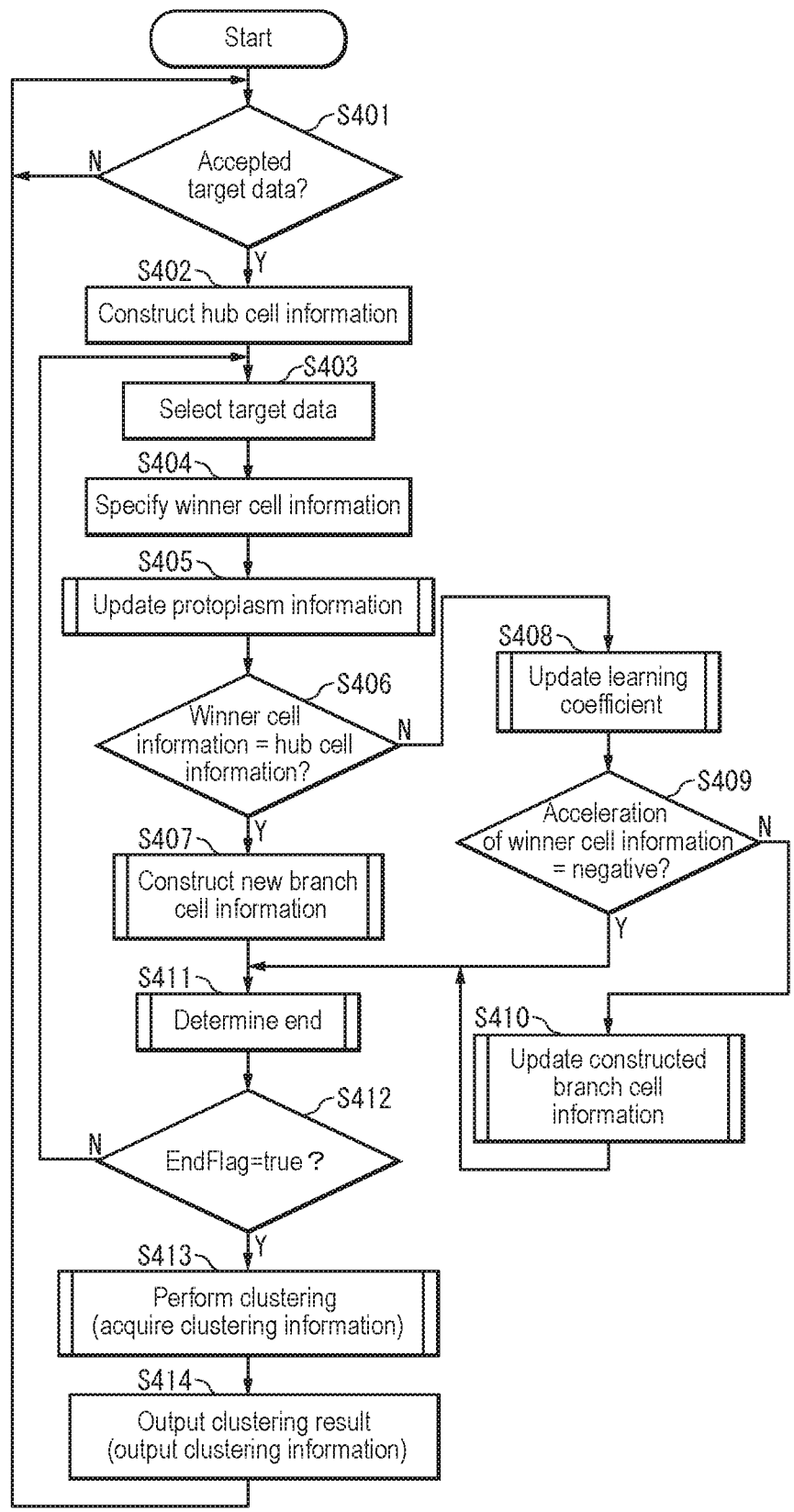
FIG. 4 is a flowchart illustrating the overall operation of the clustering apparatus 1 in the embodiment.

Next, the overall operation of the clustering apparatus 1 will be described with reference to the flowcharts. Note that an $i^{-th}$ piece of information in predetermined information is indicated as "information [i]". FIG. 4 is a flowchart illustrating the overall operation of the clustering apparatus 1.

(Step S401) The slime mold information constructing unit 12 determines whether or not the accepting unit 11 has accepted two or more pieces of target data. If accepted, the procedure advances to step S402, and, if not, the procedure returns to step S401.

(Step S402) The hub cell information constructing part 121 constructs hub cell information.

(Step S403) The branch cell information constructing part 122 selects one piece of target data from among the two or more pieces of target data. The selected target data is selected data.

(Step S404) The branch cell information constructing part 122 specifies winner cell information corresponding to the selected data, from the cell information contained in the constructed slime mold information. For example, if the slime mold information has only hub cell information, the winner cell information is naturally specified as the hub cell information. If the specified winner cell information is branch cell information, the branch cell information constructing part 122 increments, by one, the number of times of being specified as winner cell information, contained in the branch cell information. After specifying winner cell information, the branch cell information constructing part 122 increments the number of times of learning by one.

(Step S405) The branch cell information constructing part 122 updates the protoplasm information of the cell information contained in the constructed slime mold information. This processing will be described in detail with reference to the flowchart in FIG. 5.

(Step S406) The branch cell information constructing part 122 determines whether or not the specified winner cell information is hub cell information. If it is hub cell information, the procedure advances to step S407, and, if not, the procedure advances to step S408.

(Step S407) The branch cell information constructing part 122 constructs new branch cell information. This processing will be described in detail with reference to the flowchart in FIG. 6. In this case, the branch cell information constructing part 122 stores the current number of times of learning, as the number of times of learning in which a branch was added, in a predetermined storage area. The number of times of learning in which a branch was added is the number of times of learning in which new branch cell information was constructed. If the number of times of learning in which a branch was added is already stored, the storing is performed by so-called overwriting.

(Step S408) The branch cell information constructing part 122 updates the learning coefficient of the cell information contained in the constructed slime mold information. This processing will be described in detail with reference to the flowchart in FIG. 7.

(Step S409) The branch cell information constructing part 122 determines whether or not the acceleration contained in the specified winner cell information is negative. If it is negative, the procedure advances to step S411, and, if not, the procedure advances to step S410.

(Step S410) The branch cell information constructing part 122 updates the constructed branch cell information. This processing will be described in detail with reference to the flowchart in FIG. 8.

(Step S411) The branch cell information constructing part 122 determines whether or not to end the construction of the slime mold information (the construction of the branch cell information), and sets the result to a variable EndFlag. This processing will be described in detail with reference to the flowchart in FIG. 9.

(Step S412) The branch cell information constructing part 122 determines whether or not EndFlag is true. If it is true, the procedure advances to step S413, and, if not, the procedure returns to step S403.

(Step S413) The clustering unit 13 clusters the two or more pieces of target data, using the slime mold information constructed by the slime mold information constructing unit 12, and acquires cluster information, which is the clustering result. This processing will be described in detail with reference to the flowchart in FIG. 10.

(Step S414) The output unit 14 outputs the cluster information, which is a clustering result obtained by the clustering unit 13. The procedure returns to step S401.

Note that the procedure is terminated by powering off or an interruption at the end of the process in the flowchart in FIG. 4.

Figure 5:
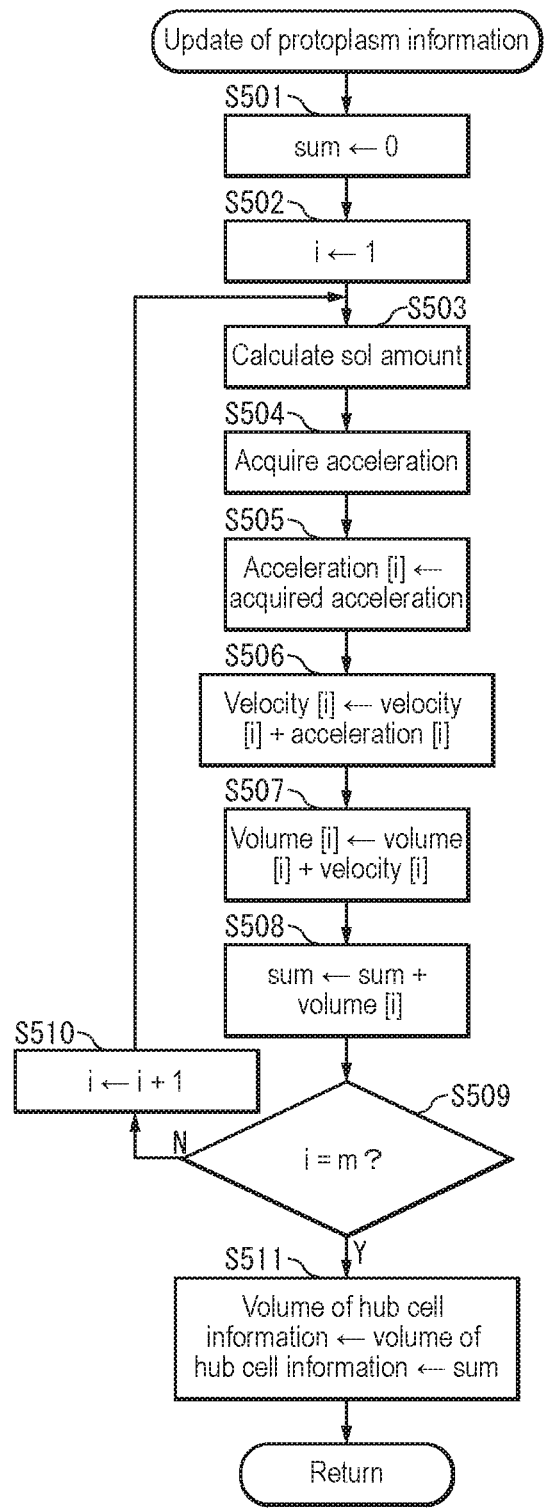
FIG. 5 is a flowchart illustrating processing that updates protoplasm information in the embodiment.

FIG. 5 is a flowchart illustrating the processing that updates protoplasm information in step S405 of the flowchart in FIG. 4. Note that, in the flowchart in FIG. 5, the constructed slime mold information has one piece of hub cell information and m pieces of branch cell information.

(Step S501) The branch cell information constructing part 122 sets 0 to a variable sum.

(Step S502) The branch cell information constructing part 122 sets 1 to a counter i.

(Step S503) The branch cell information constructing part 122 calculates a sol amount of branch cell information [i].

(Step S504) The branch cell information constructing part 122 acquires an acceleration according to whether or not the branch cell information [i] is winner cell information and whether the sol amount calculated in step S503 is positive, 0, or negative.

(Step S505) The branch cell information constructing part 122 sets the acceleration acquired in step S504 to an acceleration [i], which is an acceleration contained in the branch cell information [i].

(Step S506) The branch cell information constructing part 122 adds the acceleration [i] to a velocity [i], which is a velocity contained in the branch cell information [i].

(Step S507) The branch cell information constructing part 122 adds the velocity [i] to a volume [i], which is a volume contained in the branch cell information [i].

(Step S508) The branch cell information constructing part 122 adds the volume [i] to sum.

(Step S509) The branch cell information constructing part 122 determines whether or not i is m. If i is m, the procedure advances to step S511, and, if not, the procedure advances to step S510.

(Step S510) The branch cell information constructing part 122 increments i by one. The procedure returns to step S503.

(Step S511) The branch cell information constructing part 122 subtracts sum from the volume contained in the hub cell information. The procedure returns to the upper-level processing.

Figure 6:
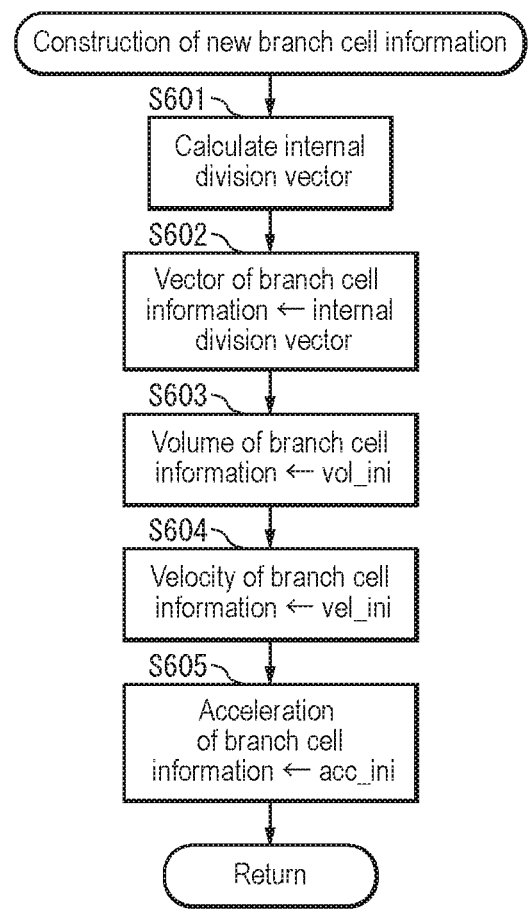
FIG. 6 is a flowchart illustrating processing that constructs new branch cell information in the embodiment.

FIG. 6 is a flowchart illustrating processing that constructs new branch cell information in step S407 of the flowchart in FIG. 4.

(Step S601) The branch cell information constructing part 122 calculates an internal division vector of a vector contained in the hub cell information and a vector that is the selected data.

(Step S602) The branch cell information constructing part 122 sets the internal division vector calculated in step S601 to a vector contained in branch cell information that is to be newly constructed.

(Step S603) The branch cell information constructing part 122 sets vol_ini, which is an initial value of a volume, to a volume contained in the branch cell information that is to be newly constructed. Note that a predetermined value has been typically set to vol_ini.

(Step S604) The branch cell information constructing part 122 sets vel_ini, which is an initial value of a velocity, to a velocity contained in the branch cell information that is to be newly constructed. Note that a predetermined value has been typically set to vel_ini.

(Step S605) The branch cell information constructing part 122 sets acc_ini, which is an initial value of an acceleration, to an acceleration contained in the branch cell information that is to be newly constructed. Note that a predetermined value has been typically set to acc_ini. The procedure returns to the upper-level processing.

Figure 7:
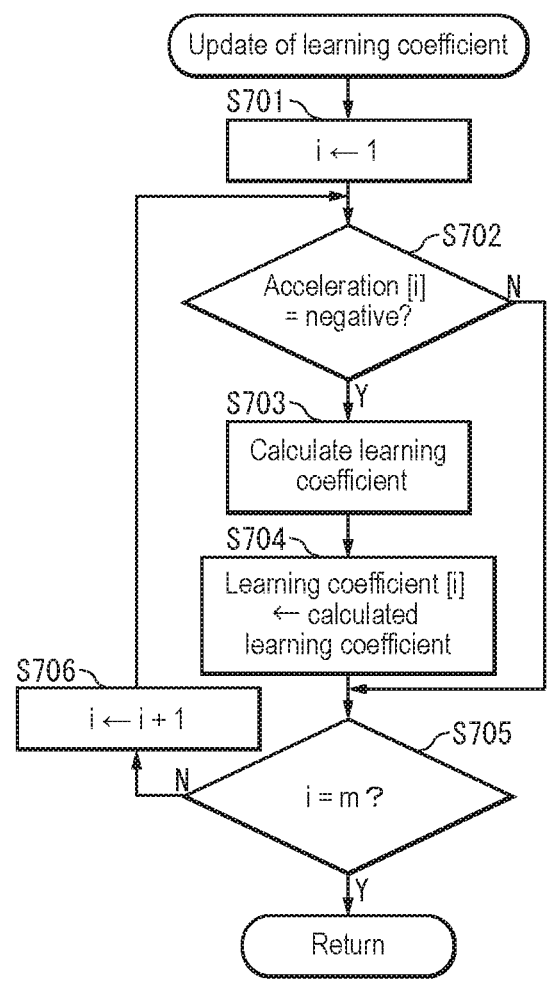
FIG. 7 is a flowchart illustrating processing that updates a learning coefficient in the embodiment.

FIG. 7 is a flowchart illustrating processing that updates a learning coefficient in step S409 of the flowchart in FIG. 4. Note that, in the flowchart in FIG. 7, the constructed slime mold information has m pieces of branch cell information.

(Step S701) The branch cell information constructing part 122 sets 1 to the counter i.

(Step S702) The branch cell information constructing part 122 determines whether or not an acceleration [i], which is an acceleration contained in the branch cell information [i], is negative. If it is negative, the procedure advances to step S703, and, if not, the procedure advances to step S705.

(Step S703) The branch cell information constructing part 122 calculates a learning coefficient for update. The learning coefficient is calculated by Formula 4.

(Step S704) The branch cell information constructing part 122 sets the learning coefficient calculated in step S703, to a learning coefficient [i], which is a learning coefficient contained in the branch cell information [i].

(Step S705) The branch cell information constructing part 122 determines whether or not i is m. If i is m, the procedure returns to the upper-level processing, and, if not, the procedure advances to step S706.

(Step S706) The branch cell information constructing part 122 increments i by one. The procedure returns to step S702.

Figure 8:
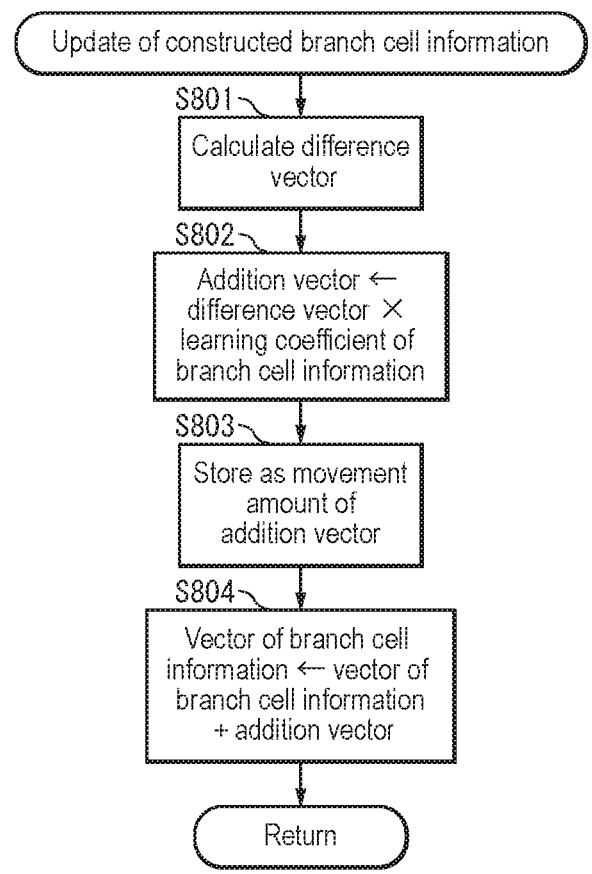
FIG. 8 is a flowchart illustrating processing that updates constructed branch cell information in the embodiment.

FIG. 8 is a flowchart illustrating processing that updates constructed branch cell information in step S410 of the flowchart in FIG. 4.

(Step S801) The branch cell information constructing part 122 calculates a difference vector, which is a difference between a vector that is the selected data and a vector contained in the branch cell information that is the winner cell information.

(Step S802) The branch cell information constructing part 122 performs scalar multiplication of the difference vector calculated in step S801 by the learning coefficient contained in the branch cell information that is the winner cell information, thereby obtaining an addition vector.

(Step S803) The branch cell information constructing part 122 calculates a length of the addition vector calculated in step S802, and stores the length as a movement amount in a predetermined storage area.

(Step S804) The branch cell information constructing part 122 adds the addition vector calculated in step S803 to the vector contained in the branch cell information that is the winner cell information. The procedure returns to the upper-level processing.

Figure 9:
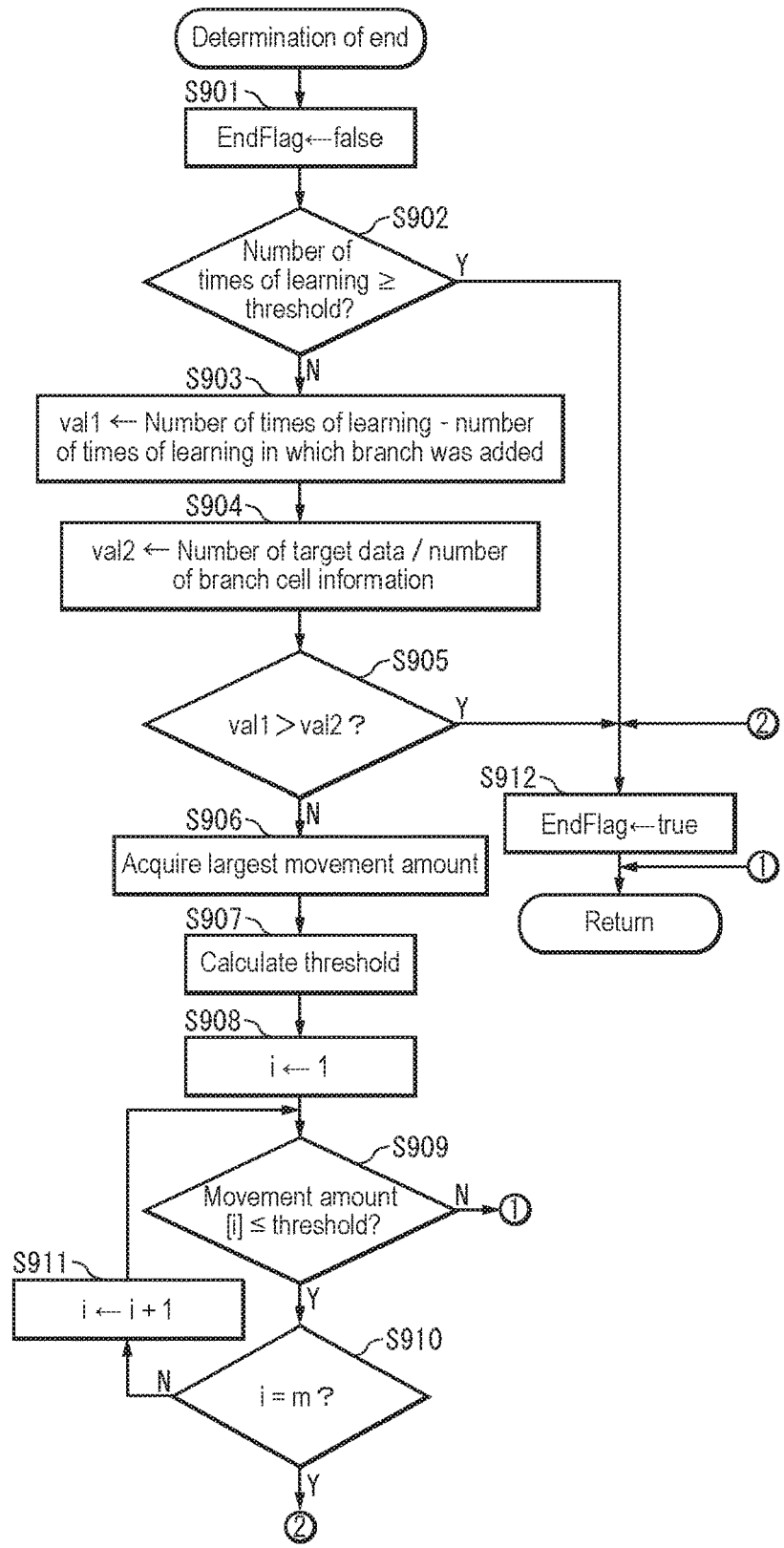
FIG. 9 is a flowchart illustrating end determination processing in the embodiment.

FIG. 9 is a flowchart illustrating end determination processing in step S411 of the flowchart in FIG. 4.

(Step S901) The branch cell information constructing part 122 sets "false" to the flag EndFlag.

(Step S902) The branch cell information constructing part 122 determines whether or not the number of times of learning is at a threshold or more. If it is at the threshold or more, the procedure advances to step S912, and, if not, the procedure advances to step S903.

(Step S903) The branch cell information constructing part 122 sets a value obtained by subtracting the number of times of learning in which a branch was added from the number of times of learning, to the variable val1 The number of times of learning in which a branch was added is the number of times of learning in which new branch cell information was constructed.

(Step S904) The branch cell information constructing part 122 sets a value obtained by dividing the number of pieces of target data by the number of pieces of branch cell information, to the variable val2.

(Step S905) The branch cell information constructing part 122 determines whether or not val1 is larger than val2. If val1 is larger than val2, the procedure advances to step S912, and, if not, the procedure advances to step S906.

(Step S906) The branch cell information constructing part 122 acquires a largest movement amount, from the movement amount stored in the predetermined storage area.

(Step S907) The branch cell information constructing part 122 calculates a threshold, using the largest movement amount acquired in step S906. The threshold is 5% of the largest movement amount.

(Step S908) The branch cell information constructing part 122 sets 1 to the counter i. Note that the branch cell information constructing part 122 determines whether or not each of the latest m movement amounts is at the threshold calculated in step S907 or less.

(Step S909) The branch cell information constructing part 122 determines whether or not the movement amount [i] is at the threshold calculated in step S907 or less. If it is at the threshold or less, the procedure advances to step S910, and, if not, the procedure returns to the upper-level processing.

(Step S910) The branch cell information constructing part 122 determines whether or not i is m. If i is m, the procedure advances to step S912, and, if not, the procedure advances to step S911.

(Step S911) The branch cell information constructing part 122 increments i by one. The procedure returns to step S909.

(Step S912) The branch cell information constructing part 122 sets "true" to EndFlag. The procedure returns to the upper-level processing.

Figure 10:
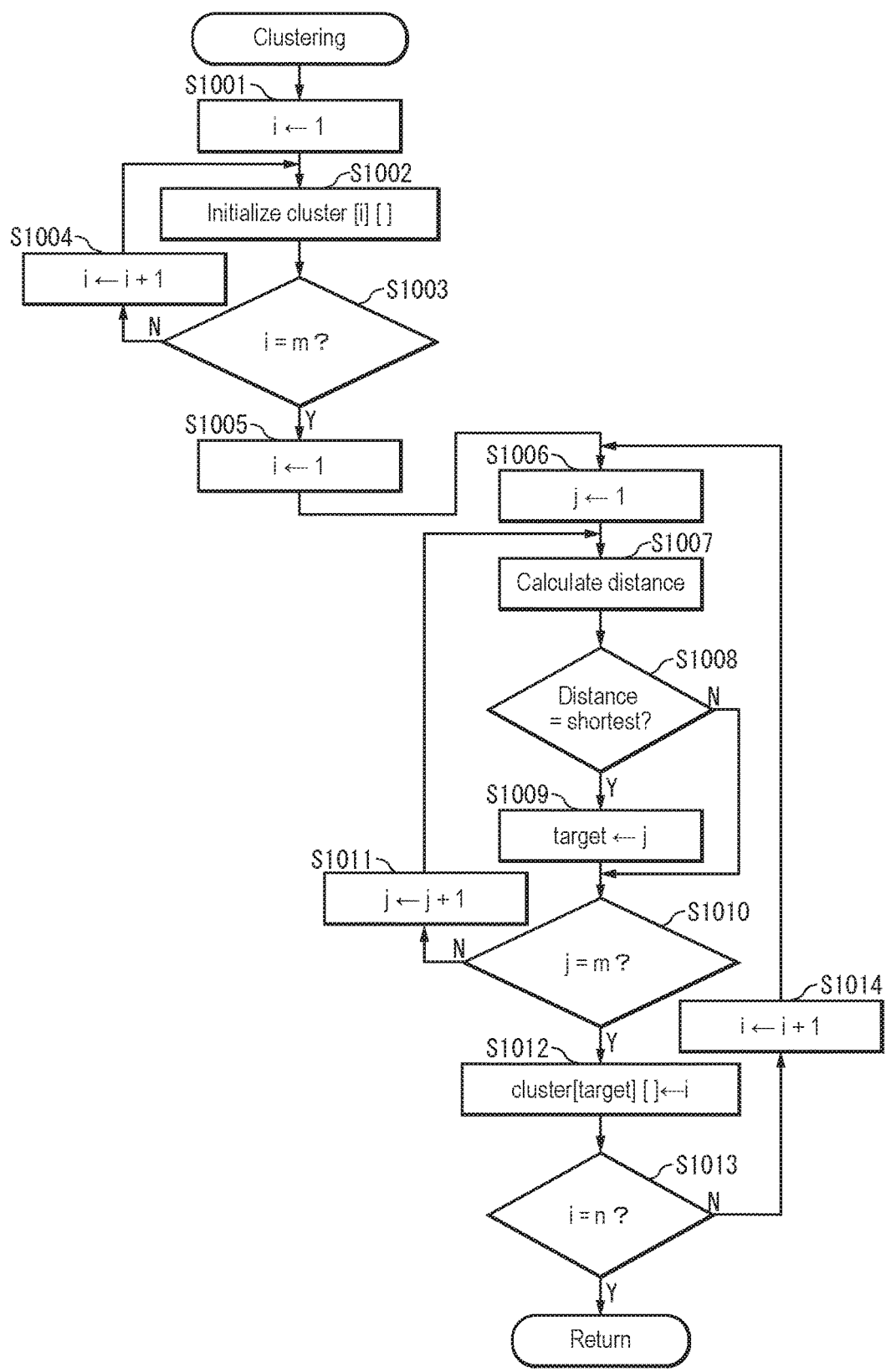
FIG. 10 is a flowchart illustrating clustering processing in the embodiment.

FIG. 10 is a flowchart illustrating clustering processing in step S413 of the flowchart in FIG. 4. Note that, in the flowchart in FIG. 10, the constructed slime mold information has m pieces of branch cell information. Furthermore, the number of pieces of target data is n.

(Step S1001) The branch cell information constructing part 122 sets 1 to the counter i.

(Step S1002) The branch cell information constructing part 122 initializes an array cluster [i] [].

(Step S1003) The branch cell information constructing part 122 determines whether or not i is m. If i is m, the procedure advances to step S1005, and, if not, the procedure advances to step S1004.

(Step S1004) The branch cell information constructing part 122 increments i by one. The procedure returns to step S1002.

(Step S1005) The branch cell information constructing part 122 sets 1 to the counter i.

(Step S1006) The branch cell information constructing part 122 sets 1 to a counter j.

(Step S1007) The branch cell information constructing part 122 calculates a distance between a vector that is the target data [i] and a vector contained in the branch cell information[j].

(Step S1008) The branch cell information constructing part 122 determines whether or not the distance calculated in step S1007 is the shortest among the distances calculated for the target data [i]. If it is the shortest, the procedure advances to step S1009, and, if not, the procedure advances to step S1010.

(Step S1009) The branch cell information constructing part 122 sets j to the variable target.

(Step S1010) The branch cell information constructing part 122 determines whether or not j is m. If j is m, the procedure advances to step S1012, and, if not, the procedure advances to step S1011.

(Step S1011) The branch cell information constructing part 122 increments j by one. The procedure returns to step S1007.

(Step S1012) The branch cell information constructing part 122 adds i as an element of the cluster[target] [].

(Step S1013) The branch cell information constructing part 122 determines whether or not i is n. If i is n, the procedure returns to the upper-level processing, and, if not, the procedure advances to step S1014.

(Step S1014) The branch cell information constructing part 122 increments i by one. The procedure returns to step S1006.

Note that the above-described overall operation of the clustering apparatus 1 is merely an example. That is to say, the overall operation of the clustering apparatus 1 is not limited to those described above.

SPECIFIC EXAMPLES

Next, specific examples of operations of the clustering apparatus 1 will be described. Note that examples and the like of information in the specific examples are merely for the sake of convenience, and may be different from actual calculation results.

Example 1

In this example, an example will be described in which hub cell information is constructed. The constructing hub cell information is, in other words, constructing slime mold information having one piece of hub cell information. In this example, it is assumed that the target data is as in FIG. 11. That is to say, it is assumed that the accepting unit 11 has accepted the target data shown in FIG. 11. In FIG. 11, an ID for uniquely specifying a record (target data) is associated with each of one or more pieces of target data. The ID is also information for identifying each of one or more pieces of target data. Each of one or more pieces of target data has n elements (item names: Dimension 1, Dimension 2, . . . , Dimension n-1, and Dimension n). It is assumed that each of the n elements is the number of times that a predetermined word appears in two or more documents.

First, the accepting unit 11 accepts the target data in FIG. 11.

Next, the hub cell information constructing part 121 calculates a mean of the vectors that are the target data in FIG. 11, as a center-of-gravity vector. The hub cell information constructing part 121 constructs hub cell information having the center-of-gravity vector. The hub cell information constructing part 121 provides the hub cell information with initial values of a volume, a velocity, and an acceleration, which are protoplasm information. Note that all of the initial values are "0".

The thus constructed hub cell information is, for example, as in FIG. 12. In FIG. 12, the hub cell information has a vector in the same number of dimensions as that of the target data (item names: Dimension 1, Dimension 2, . . . , Dimension n-1, and Dimension n) and protoplasm information (item names: Volume, Velocity, and Acceleration). That is, the slime mold information constructing unit 12 constructs slime mold information having the hub cell information in FIG. 12, by constructing this hub cell information.

Example 2

In this example, an example will be described in which branch cell information is constructed. The constructing branch cell information is, in other words, constructing slime mold information having one piece of hub cell information and one or more pieces of branch cell information. In this example, it is assumed that the target data is as in FIG. 11, as in Example 1. In this example, it is assumed that slime mold information having the hub cell information shown in FIG. 12 has been constructed. Each time new branch cell information is constructed or each time the constructed branch cell information is updated, the branch cell information constructing part 122 determines whether or not to end the construction of the branch cell information. However, in this example, a description of this determination has been omitted.

First, it is assumed that the branch cell information constructing part 122 has selected the target data with "ID=012" in FIG. 11, from the target data in FIG. 11. The selected target data is selected data. Then, the branch cell information constructing part 122 specifies winner cell information, which is cell information having the shortest distance to "ID=012" in FIG. 11 that is the selected data, from the cell information contained in the constructed slime mold information. Note that the slime mold information has only the hub cell information in FIG. 12. Accordingly, the branch cell information constructing part 122 specifies the hub cell information, as winner cell information. In this case, the branch cell information constructing part 122 increments the number of times "0" of learning by one, thereby updating the number of times of learning to "1".

Next, the branch cell information constructing part 122 updates the protoplasm information of the cell information contained in the constructed slime mold information. Note that the slime mold information has only the hub cell information in FIG. 12. Accordingly, the branch cell information constructing part 122 does not update the protoplasm information.

Next, since the winner cell information is hub cell information, the branch cell information constructing part 122 calculates an internal division vector of "ID=012" in FIG. 11 that is the selected data and the vector contained in the hub cell information in FIG. 12, using a predetermined internal division ratio. The branch cell information constructing part 122 constructs branch cell information having the internal division vector. The branch cell information constructing part 122 provides the branch cell information with a volume "1", a velocity "1", and an acceleration "1", which are initial values of the protoplasm information. The branch cell information constructing part 122 provides the branch cell information with a learning coefficient "1" and a number of times "0" of being specified as winner cell information, which are initial values of the parameters.

The thus constructed branch cell information is, for example, as in FIG. 13. In FIG. 13, the branch cell information has a vector in the same number of dimensions as that of the target data (item names: Dimension 1, Dimension 2, . . . , Dimension n–1, and Dimension n), protoplasm information (item names: Volume, Velocity, and Acceleration), and parameters (item names: Learning coefficient and Number of times of being winner). The item name "Number of times of being winner" is the number of times of being specified as winner cell information.

Next, it is assumed that the branch cell information constructing part 122 has selected the target data with "ID=014" in FIG. 11, from the target data in FIG. 11. The selected target data is selected data. Then, the branch cell information constructing part 122 specifies winner cell information, which is cell information having the shortest distance to "ID=014" in FIG. 11 that is the selected data, from the cell information contained in the constructed slime mold information. Note that the slime mold information has the hub cell information in FIG. 12 and the branch cell information in FIG. 13. It is assumed that the branch cell information constructing part 122 specifies the hub cell information in FIG. 12 as winner cell information. In this case, the branch cell information constructing part 122 increments the number of times "1" of learning by one, thereby updating the number of times of learning to "2".

Next, the branch cell information constructing part 122 updates the protoplasm information of the cell information contained in the constructed slime mold information. Note that the slime mold information has the hub cell information in FIG. 12 and the branch cell information in FIG. 13. Accordingly, the branch cell information constructing part 122 first updates the protoplasm information contained in the branch cell information in FIG. 13.

The volume contained in the hub cell information in FIG. 12 is "0". The current number of times of learning is "2". The number of times that the branch cell information in FIG. 13 is specified as winner cell information is "0". The number of pieces of branch cell information contained in the constructed slime mold information is "1". The number of pieces of branch cell information other than the branch cell information in FIG. 13 is "0". Accordingly, the branch cell information constructing part 122 calculates a sol amount "2" for the branch cell information in FIG. 13, according to Formula 3, using these pieces of information.

Next, since the calculated sol amount "2" is positive and the branch cell information in FIG. 13 is not the winner cell information, the branch cell information constructing part 122 acquires an acceleration "0" for the branch cell information in FIG. 13, according to Table 1. The branch cell information constructing part 122 updates the acceleration "1" contained in the branch cell information in FIG. 13, to the acquired acceleration "0".

Next, the branch cell information constructing part 122 adds the acceleration "0" after the update to the velocity "1" contained in the branch cell information in FIG. 13, thereby updating the velocity to "1".

Next, the branch cell information constructing part 122 adds the velocity "1" after the update to the volume "1" contained in the branch cell information in FIG. 13, thereby updating the volume to "2". Since the branch cell information contained in the constructed slime mold information is only the branch cell information in FIG. 13, the sum of the volumes contained in the branch cell information contained in the constructed slime mold information is "2".

Next, the branch cell information constructing part 122 subtracts the sum volume "2" of the branch cell information from the volume "0" contained in the hub cell information in FIG. 12, thereby updating the volume contained in the hub cell information to "–2".

The hub cell information and the branch cell information whose protoplasm information has been updated in this manner are respectively as in FIGS. 14 and 15.

Next, since the winner cell information is the hub cell information, the branch cell information constructing part 122 calculates an internal division vector of "ID=014" in FIG. 11 that is the selected data and the vector contained in the hub cell information in FIG. 15 whose protoplasm information has been updated, using a predetermined internal division ratio. The branch cell information constructing part 122 constructs branch cell information having the internal division vector. The branch cell information constructing part 122 provides the branch cell information with a volume "1", a velocity "1", and an acceleration "1", which are initial values of the protoplasm information. The branch cell information constructing part 122 provides the branch cell information with a learning coefficient "1" and a number of times "0" of being specified as winner cell information, which are initial values of the parameters.

The thus constructed branch cell information is, for example, as in FIG. 16.

Next, it is assumed that the branch cell information constructing part 122 has selected the target data with "ID=015" in FIG. 11, from the target data in FIG. 11. The selected target data is selected data. Then, the branch cell information constructing part 122 specifies winner cell information, which is cell information having the shortest distance to "ID=015" in FIG. 11 that is the selected data, from the cell information contained in the constructed slime mold information. Note that the slime mold information has the hub cell information in FIG. 14 and the branch cell information in FIG. 16. Thus, the branch cell information constructing part 122 specifies the branch cell information with "ID=1" in FIG. 16, as winner cell information. In this case, the branch cell information constructing part 122 increments the number of times "2" of learning by one, thereby updating the number of times of learning to "3". In this case, the branch cell information constructing part 122 increments the number of times "0" of being winner contained in the branch cell information with "ID=1" in FIG. 16 by one, thereby updating the number of times of being winner to "1".

Next, the branch cell information constructing part 122 updates the protoplasm information of the cell information contained in the constructed slime mold information. Note that the slime mold information has the hub cell information in FIG. 14 and the branch cell information in FIG. 16. Accordingly, the branch cell information constructing part 122 first updates the protoplasm information contained in the branch cell information in FIG. 16.

First, the branch cell information constructing part 122 calculates a sol amount "−3" for the branch cell information with "ID=1" in FIG. 16, according to Formula 3, as in the manner described above. Furthermore, the branch cell information constructing part 122 acquires an acceleration "0" for the branch cell information with "ID=1" in FIG. 16, according to Table 1, as in the manner described above. Furthermore, the branch cell information constructing part 122 updates the acceleration "0" contained in the branch cell information with "ID=1" in FIG. 16, to the acquired acceleration "0", as in the manner described above. Furthermore, the branch cell information constructing part 122 adds the acceleration "0" after the update to the velocity "1" contained in the branch cell information with "ID=1" in FIG. 16, thereby updating the velocity to "1", as in the manner described above. Furthermore, the branch cell information constructing part 122 adds the velocity "1" after the update to the volume "2" contained in the branch cell information with "ID=1" in FIG. 16, thereby updating the volume to "3", as in the manner described above.

Next, the branch cell information constructing part 122 calculates a sol amount "−1" for the branch cell information with "ID=2" in FIG. 16, according to Formula 3, as in the manner described above. Furthermore, the branch cell information constructing part 122 acquires an acceleration "−1" for the branch cell information with "ID=2" in FIG. 16, according to Table 1, as in the manner described above. Furthermore, the branch cell information constructing part 122 updates the acceleration "1" contained in the branch cell information with "ID=2" in FIG. 16, to the acquired acceleration "−1", as in the manner described above. Furthermore, the branch cell information constructing part 122 adds the acceleration "−1" after the update to the velocity "1" contained in the branch cell information with "ID=2" in FIG. 16, thereby updating the velocity to "0", as in the manner described above. Furthermore, the branch cell information constructing part 122 adds the velocity "0" after the update to the volume "1" contained in the branch cell information with "ID=2" in FIG. 16, thereby updating the volume to "1", as in the manner described above.

Next, the branch cell information constructing part 122 calculates a sum "4" of the volumes "3" and "1" after the update contained in the branch cell information in FIG. 16, as in the manner described above. Furthermore, the branch cell information constructing part 122 subtracts the sum volume "4" of the branch cell information from the volume "−2" contained in the hub cell information in FIG. 14, thereby updating the volume contained in the hub cell information to "−6".

The hub cell information and the branch cell information whose protoplasm information has been updated in this manner are respectively as in FIGS. 17 and 18.

Next, since winner cell information is branch cell information, the branch cell information constructing part 122 updates the learning coefficient contained in the branch cell information in FIG. 18. In this example, the acceleration contained in the branch cell information with "ID=1" in FIG. 18 that is the winner cell information is not negative. Accordingly, the branch cell information constructing part 122 does not update the learning coefficient, and updates the vector contained in the branch cell information.

For example, in the branch cell information with "ID=2" in FIG. 18, the acceleration contained in the branch cell information is negative, and thus the branch cell information constructing part 122 updates the learning coefficient of the branch cell information, according to Formula 4.

It is assumed that the initial value of the learning coefficient is "0.1". The current number of times of learning is "3". Accordingly, the branch cell information constructing part 122 calculates a learning coefficient "0.1/(0.1×3+1) =0.077" for the branch cell information with "ID=2" in FIG. 18. Furthermore, the branch cell information constructing part 122 updates the learning coefficient "1" contained in the branch cell information with "ID=2" in FIG. 18, to the learning coefficient.

Next, the branch cell information constructing part 122 updates the vector contained in the branch cell information with "ID=1" in FIG. 18 that is the winner cell information, according to Formula 5. First, the branch cell information constructing part 122 calculates a difference vector of "ID=015" in FIG. 11 that is the selected data and the vector contained in the branch cell information with "ID=1" in FIG. 18. Furthermore, the branch cell information constructing part 122 performs scalar multiplication of the difference vector by the learning coefficient "1" contained in the branch cell information with "ID=1" in FIG. 18, thereby obtaining an addition vector. Furthermore, the branch cell information constructing part 122 adds the addition vector to the vector contained in the branch cell information with "ID=1" in FIG. 14.

The thus constructed branch cell information is, for example, as in FIG. 19.

Furthermore, the branch cell information constructing part 122 repeatedly performs construction of new branch cell information and update of the constructed branch cell information. The ultimately constructed branch cell information is, for example, as in FIG. 20.

Example 3

In this example, an example will be described in which it is determined whether or not to end the construction of the branch cell information. In this example, each time new branch cell information is constructed or each time the constructed branch cell information is updated, the branch cell information constructing part 122 performs the following determination.

First, it is assumed that the threshold of the number of times of learning is determined in advance as "100". In this case, the branch cell information constructing part 122 determines whether or not the number of times of learning after constructing new branch cell information or after updating the constructed branch cell information is 100 or more. Furthermore, if the number of times of learning is 100 or more, the branch cell information constructing part 122 ends the construction of the branch cell information. If the number of times of learning is less than 100, the branch cell information constructing part 122 performs next end determination.

Next, the branch cell information constructing part 122 calculates a value obtained by subtracting the latest number of times of learning in which new branch cell information was updated, from the current number of times of learning. This value is taken as a value 1. Next, the branch cell information constructing part 122 calculates a value obtained by dividing the number of pieces of target data by the number of pieces of cell information contained in the constructed slime mold information. This value is taken as a value 2. Furthermore, the branch cell information constructing part 122 determines whether or not the value 1 is larger than the value 2. If the value 1 is larger than the value 2, the branch cell information constructing part 122 ends the construction of the branch cell information. If the value 1 is equal to or smaller than the value 2, the branch cell information constructing part 122 performs next end determination.

Next, it is assumed that a largest movement amount, which is a movement amount with the largest value, is "10" among the movement amounts up to the current time. Furthermore, it is assumed that the threshold of the movement amount is "0.5" that is 5% of the largest movement amount. It is determined whether or not each of the latest five movement amounts among the movement amounts up to the current time is 0.5 or less. In this case, the branch cell information constructing part 122 determines whether or not each of the latest five movement amounts is 0.5 or less. Furthermore, if all of the latest five movement amounts are 0.5 or less, the branch cell information constructing part 122 ends the construction of the branch cell information. If even at least one of the latest five movement amounts is larger than 0.5, the branch cell information constructing part 122 does not end the construction of the branch cell information. Then, the branch cell information constructing part 122 newly selects one piece of target data.

Example 4

In this example, an example will be described in which two or more pieces of target data are clustered based on the branch cell information contained in the slime mold information, In this example, it is assumed that the target data is as in FIG. 11. It is assumed that the slime mold information constructing unit 12 has constructed slime mold information having the branch cell information in FIG. 20.

First, the clustering unit 13 calculates a distance between the target data with "ID=011" in FIG. 11 and the vector contained in each of one or more pieces of branch cell information in FIG. 20. It is assumed that, among the one or more distances, the distance calculated for the vector contained in the branch cell information with "ID=3" in FIG. 20 is the shortest. The clustering unit 13 constructs association information between "ID=3" and "ID=011".

Next, the clustering unit 13 calculates a distance between the target data with "ID=012" in FIG. 11 and the vector contained in each of one or more pieces of branch cell information in FIG. 20. It is assumed that, among the one or more distances, the distance calculated for the vector contained in the branch cell information with "ID=4" in FIG. 20 is the shortest. The clustering unit 13 constructs association information between "ID=4" and "ID=012".

As described above, the clustering unit 13 constructs the cluster information shown in FIG. 21. The cluster information has information for identifying a cluster (item name: Cluster ID) and information for identifying target data constituting the cluster (item name: Target ID). The information for identifying a cluster is also information for identifying branch cell information.

Next, the output unit 14 outputs the cluster information in FIG. 21. In this case, the output unit 14 may output the cluster information, for example, in the form of FIG. 21, or in a mode such as a so-called conceptual diagram or a schematic diagram.

As described above, with the clustering apparatus 1 according to this embodiment, it is possible to perform clustering more precisely, without setting parameters in advance. Accordingly, the clustering can be performed more easily than in conventional examples, and thus the amount of effort required for setting parameters can be reduced. Furthermore, the clustering apparatus 1 can allow users having no techniques or experiences for parameter setting to easily perform clustering, and thus the learning cost for clustering can be reduced.

Furthermore, the clustering apparatus in the foregoing embodiments may be, for example, either a stand-alone apparatus or a server apparatus in a server-client system.

Furthermore, in the foregoing embodiments, each process or each function may be realized as centralized processing using a single apparatus or a single system, or may be realized as distributed processing using multiple apparatuses.

Furthermore, in the foregoing embodiments, each constituent element may be configured by dedicated hardware, or, alternatively, constituent elements that can be realized by software may be realized by executing a program. For example, each constituent element may be realized by a program execution unit such as a CPU reading and executing a software program stored in a storage medium such as a hard disk or a semiconductor memory.

The software that realizes the clustering apparatus in the foregoing embodiments may be the following sort of program. Specifically, this program is a program for causing a computer to function as: an accepting unit that accepts two or more pieces of target data, each of which is data targeted for clustering and is data having one or at least two attribute values; a slime mold information constructing unit that constructs, using the two or more pieces of target data, slime mold information, which is information obtained by modeling a predation behavior by a slime mold, and is information having two or more pieces of cell information consisting of hub cell information corresponding to a central cell of the slime mold and branch cell information corresponding to a cell that is divided from the central cell for predation; a clustering unit that clusters the two or more pieces of target data into clusters in the same number as that of the pieces of branch cell information, based on a distance between each of one or more pieces of branch cell information contained in the slime mold information constructed by the slime mold information constructing unit and each of the two or more pieces of target data; and an output unit that outputs a clustering result obtained by the clustering unit, wherein the slime mold information constructing unit functions as: a hub cell information constructing part that constructs hub cell information using the two or more pieces of target data; and a branch cell information constructing part that performs construction of new branch cell information and update of the constructed branch cell information, using the two or more pieces of target data and the constructed slime mold information.

In the program, the functions realized by the program do not include functions that can be realized only by hardware.

Furthermore, the program may be executed by downloads from a server or the like, or may be executed by reading a program stored in a predetermined storage medium (e.g., an optical disk such as a CD-ROM, a magnetic disk, a semiconductor memory, etc.). Furthermore, the program may be used as a program forming a program product.

Furthermore, the computer that executes the program may be a single computer, or may be multiple computers. That is to say, centralized processing may be performed, or distributed processing may be performed.

Figure 22:
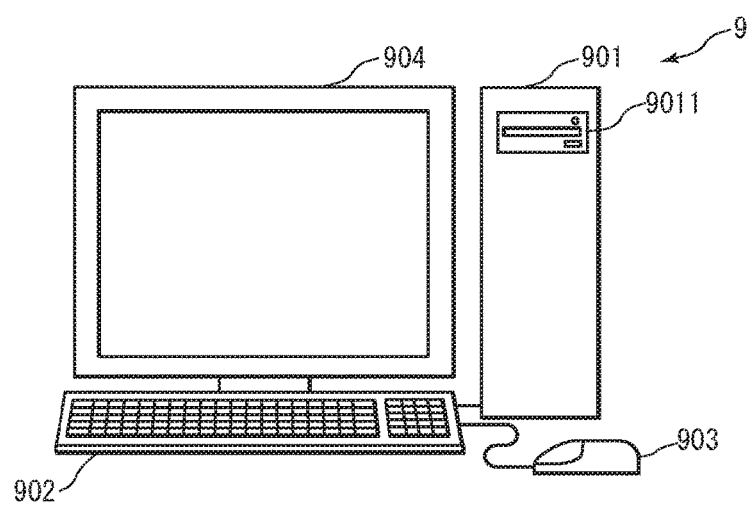
FIG. 22 is a schematic view of a computer system in the embodiments.

FIG. 22 is a schematic view showing a computer system 9 that executes the programs described above to realize the clustering apparatus and the like in the foregoing embodiments. The foregoing embodiments may be realized using computer hardware and computer programs executed thereon.

In FIG. 22, the computer system 9 is provided with a computer 901 including a CD-ROM drive 9011, a keyboard 902, a mouse 903, and a monitor 904.

Figure 23:
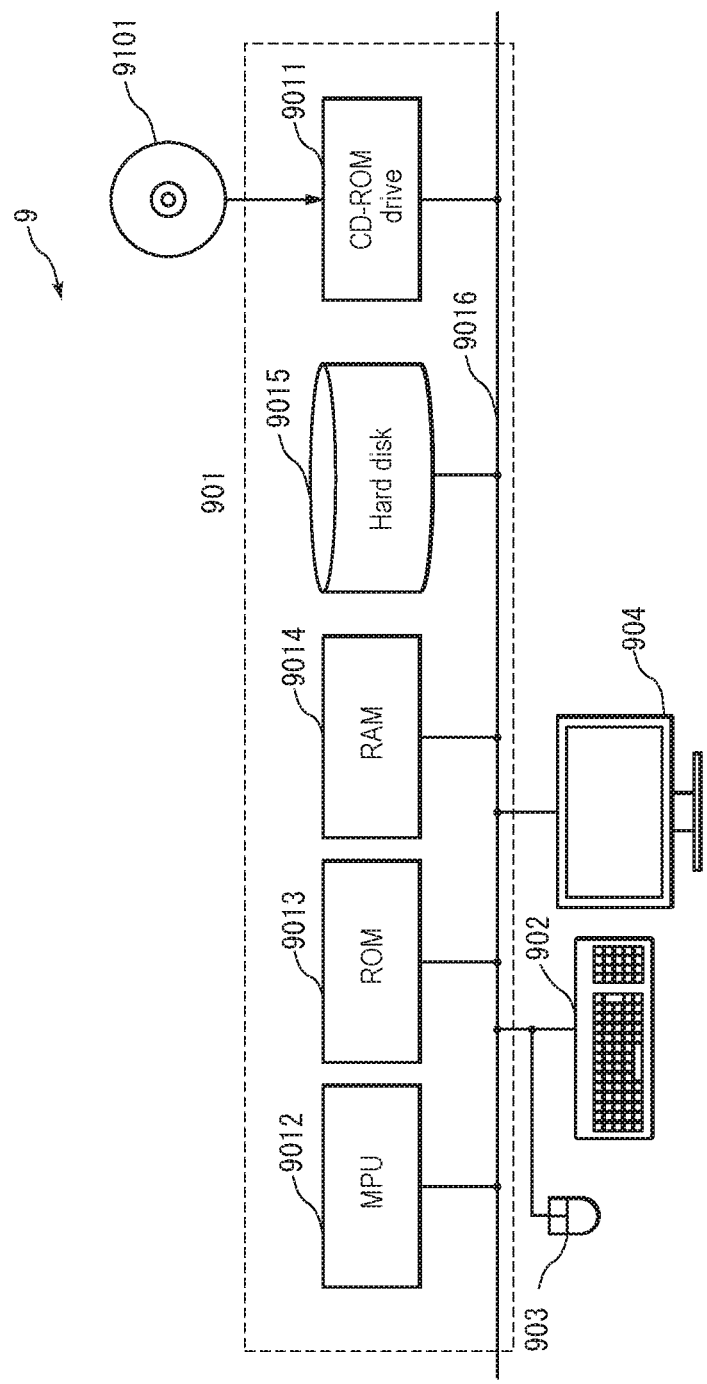
FIG. 23 is a block diagram of the computer system in the embodiments.

FIG. 23 is a block diagram of the computer system 9. In FIG. 23, the computer 901 is provided with, in addition to the CD-ROM drive 9011, an MPU 9012, a ROM 9013 in which a program such as a boot up program is to be stored, an RAM 9014 that is connected to the MPU 9012 and is a memory in which a command of an application program is temporarily stored and a temporary storage area is provided, a hard disk 9015 in which an application program, a system program, and data are stored, and a bus 9016 that connects the CD-ROM drive 9011, the MPU 9012, and the like. Although not shown, the computer 901 may further include a network card that provides connection to a LAN.

The program for causing the computer system 9 to execute the functions of the clustering apparatus and the like in the foregoing embodiments may be stored in a CD-ROM 9101 that is inserted into the CD-ROM drive 9011, and be transmitted to the hard disk 9015. Alternatively, the program may be transmitted via an unshown network to the computer 901 and stored in the hard disk 9015. At the time of execution, the program is loaded into the RAM 9014. The program may be loaded from the CD-ROM 9101 or directly from a network.

The program does not necessarily have to include, for example, an operating system (OS) or a third party program to cause the computer 901 to execute the functions of the clustering apparatus and the like in the foregoing embodiments. The program may only include a command portion to call an appropriate function (module) in a controlled mode and obtain desired results. The manner in which the computer system 9 operates is well known, and thus a detailed description thereof has been omitted.

The present invention is not limited to the embodiments set forth herein. Various modifications are possible within the scope of the present invention.

INDUSTRIAL APPLICABILITY

As described above, the clustering apparatus according to the present invention has an effect that clustering can be performed more precisely without setting parameters in advance, and thus this apparatus is useful as a software program and the like for performing clustering.

LIST OF REFERENCE NUMERALS

1 Clustering apparatus
11 Accepting unit
12 Slime mold information constructing unit
13 Clustering unit
14 Output unit
121 Hub cell information constructing part
122 Branch cell information constructing part

The invention claimed is:

1. A clustering apparatus, comprising: a processor; and a non-transitory memory storing a program, wherein the program, when executed by the processor, causes the processor to function as:
an accepting unit that accepts two or more pieces of target data, each of which is data targeted for clustering and is a vector having two or more elements;
a slime mold information constructing unit that constructs, using the two or more pieces of target data, slime mold information, which is information having two or more pieces of cell information constituted by one piece of hub cell information having a vector in the same number of dimensions as that of the target data and one or more pieces of branch cell information each having a vector in the same number of dimensions as that of the target data;
a clustering unit that associates each of the two or more pieces of target data with branch cell information having the shortest distance from the vector contained in the branch cell information to the target data, among the one or more pieces of branch cell information contained in the slime mold information constructed by the slime mold information constructing unit, thereby clustering the target data into clusters in the same number as that of the pieces of branch cell information; and
an output unit that outputs a clustering result obtained by the clustering unit, wherein the slime mold information constructing unit includes:
a hub cell information constructing part that acquires representative data, which is a vector representing the two or more pieces of target data, and constructs hub cell information having a vector that is the representative data; and
a branch cell information constructing part that performs processing that constructs new branch cell information, and processing that updates the vector contained in the constructed branch cell information so as to reduce a distance to any one piece of target data among the two or more pieces of target data, using the two or more pieces of target data and the constructed slime mold information, wherein each time the vector contained in the constructed branch cell information is updated, the branch cell information constructing part calculates a movement amount, which is a distance between a vector before update and a vector after the update, for the branch cell information, acquires a largest movement amount, which is a movement amount with the largest value among calculated movement amounts, and, in a case where the calculated movement amount is five percent or less of the largest movement amount successively for a predetermined number of times, ends the construction of the branch cell information.

2. A clustering method comprising:
an accepting step of accepting two or more pieces of target data, each of which is data targeted for clustering and is data having two or more elements;
a slime mold information constructing step of constructing, using the two or more pieces of target data, slime mold information, which is information obtained by modeling a predation behavior by a slime mold, and is information having two or more pieces of cell information constituted by one piece of hub cell information corresponding to a central cell of the slime mold and one or more pieces of branch cell information each corresponding to a cell that is divided from the central cell for predation, the hub cell information and the branch cell information each having a vector in the same number of dimensions as that of the target data;

a clustering step of associating each of the two or more pieces of target data with branch cell information having the shortest distance from the vector contained in the branch cell information to the target data, among the one or more pieces of branch cell information contained in the slime mold information constructed by the slime mold information constructing step, thereby clustering the target data into clusters in the same number as that of the pieces of branch cell information; and an output step of outputting a clustering result obtained by the clustering step, wherein the slime mold information constructing step includes:
  a hub cell information constructing step of acquiring representative data, which is a vector representing the two or more pieces of target data, and constructing hub cell information having a vector that is the representative data; and
  a branch cell information constructing step of performing processing that constructs new branch cell information, and processing that updates the vector contained in the constructed branch cell information so as to reduce a distance to any one piece of target data among the two or more pieces of target data, using the two or more pieces of target data and the constructed slime mold information, wherein each time the vector contained in the constructed branch cell information is updated, the branch cell information constructing part calculates a movement amount, which is a distance between a vector before update and a vector after the update, for the branch cell information, acquires a largest movement amount, which is a movement amount with the largest value among calculated movement amounts, and, in a case where the calculated movement amount is five percent or less of the largest movement amount successively for a predetermined number of times, ends the construction of the branch cell information.

3. A non-transitory storage medium in which a program is stored, the program causing a computer to function as:
  an accepting unit that accepts two or more pieces of target data, each of which is data targeted for clustering and is a vector having two or more elements;
  a slime mold information constructing unit that constructs, using the two or more pieces of target data, slime mold information, which is information obtained by modeling a predation behavior by a slime mold, and is information having two or more pieces of cell information constituted by one piece of hub cell information corresponding to a central cell of the slime mold and one or more pieces of branch cell information each corresponding to a cell that is divided from the central cell for predation, the hub cell information and the branch cell information each having a vector in the same number of dimensions as that of the target data;
  a clustering unit that associates each of the two or more pieces of target data with branch cell information having the shortest distance from the vector contained in the branch cell information to the target data, among the one or more pieces of branch cell information contained in the slime mold information constructed by the slime mold information constructing unit, thereby clustering the target data into clusters in the same number as that of the pieces of branch cell information; and
  an output unit that outputs a clustering result obtained by the clustering unit, wherein the program causes the slime mold information constructing unit to function as: a hub cell information constructing part that acquires representative data, which is a vector representing the two or more pieces of target data, and constructs hub cell information having a vector that is the representative data; and
  a branch cell information constructing part that performs processing that constructs new branch cell information, and processing that updates the vector contained in the constructed branch cell information so as to reduce a distance to any one piece of target data among the two or more pieces of target data, using the two or more pieces of target data and the constructed slime mold information, wherein each time the vector contained in the constructed branch cell information is updated, the branch cell information constructing part calculates a movement amount, which is a distance between a vector before update and a vector after the update, for the branch cell information, acquires a largest movement amount, which is a movement amount with the largest value among calculated movement amounts, and, in a case where the calculated movement amount is five percent or less of the largest movement amount successively for a predetermined number of times, ends the construction of the branch cell information.

4. The clustering apparatus according to claim 1, wherein the branch cell information constructing part selects one piece of target data once or more from among the two or more pieces of target data, specifies winner cell information, which is cell information having a vector having the shortest distance to the one piece of target data, from the constructed slime mold information, and, in a case where the winner cell information is hub cell information, constructs new branch cell information, and, in a case where the winner cell information is branch cell information, updates a vector contained in the branch cell information so as to reduce a distance to the one piece of target data.

5. The clustering apparatus according to claim 1, wherein the branch cell information constructing part selects one piece of target data once or more from among the two or more pieces of target data, and, in a case where cell information having a vector having the shortest distance to the one piece of target data is hub cell information, calculates a vector that internally divides a vector contained in the hub cell information and the one piece of target data, and constructs new branch cell information having the calculated vector.

6. The clustering apparatus according to claim 1,
  wherein the branch cell information has a learning coefficient, which is a coefficient that is used to update a vector contained in the branch cell information, and
  the branch cell information constructing part selects one piece of target data once or more from among the two or more pieces of target data, and, in a case where cell information having a vector having the shortest distance to the one piece of target data is branch cell information, updates a vector contained in the branch cell information so as to reduce a distance to the one piece of target data using the learning coefficient contained in the branch cell information, the vector contained in the branch cell information, and the one piece of target data.

7. The clustering apparatus according to claim 1, wherein the branch cell information constructing part selects one piece of target data once or more from among the two or more pieces of target data, counts the number of times of learning, which is the number of times that the selection was performed, each time the selection was performed, and, in a case where the number of times of learning is large enough to satisfy a predetermined condition, ends the construction of the branch cell information.

8. The clustering apparatus according to claim 1, wherein the branch cell information constructing part selects one piece of target data once or more from among the two or more pieces of target data, counts the number of times of learning, which is the number of times that the selection was performed, each time the selection was performed, and, in a case where a difference between the current number of times of learning and the number of times of learning in which new branch cell information was constructed is larger than a value obtained by dividing the number of pieces of target data by the number of pieces of branch cell information contained in the constructed slime mold information, ends the construction of the branch cell information.

* * * * *